US012755776B2

(12) United States Patent
Cho et al.

(10) Patent No.: US 12,755,776 B2

(45) Date of Patent: Oct. 6, 2026

(54) MEMORY DEVICE FOR CONTROLLING SHIELDING BIT LINES

(71) Applicant: Samsung Electronics Co., Ltd., Suwon-si (KR)

(72) Inventors: Junhee Cho, Suwon-si (KR); Incheol Nam, Suwon-si (KR); Kyuchang Kang, Suwon-si (KR); Sangyun Kim, Suwon-si (KR); Sunyoung Kim, Suwon-si (KR); Jongwook Park, Suwon-si (KR); Hoseok Lee, Suwon-si (KR); Kangsub Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 18/784,796

(22) Filed: Jul. 25, 2024

(65) Prior Publication Data

US 2025/0149080 A1 May 8, 2025

(30) Foreign Application Priority Data

Nov. 3, 2023 (KR) ........................ 10-2023-0151035

(51) Int. Cl.
*G11C 11/4091* (2006.01)
*G11C 11/4094* (2006.01)

(52) U.S. Cl.
CPC ...... *G11C 11/4091* (2013.01); *G11C 11/4094* (2013.01)

(58) Field of Classification Search
CPC ............ G11C 11/4091; G11C 11/4094; G11C 11/4097; G11C 7/18
USPC ........................................ 365/185.21, 185.24
See application file for complete search history.

(56) References Cited

U.S. PATENT DOCUMENTS

| | | | | | |
|---|---|---|---|---|---|
| 5,680,347 | A * | 10/1997 | Takeuchi | G11C 16/0483 | |
| | | | | 365/185.23 | |
| 8,705,297 | B2 | 4/2014 | Kim et al. | | |
| 9,659,636 | B2 | 5/2017 | Lee | | |
| 10,217,795 | B1 * | 2/2019 | Franca-Neto | H10B 63/84 | |
| 10,643,714 | B2 | 5/2020 | Sakui | | |
| 10,672,483 | B2 | 6/2020 | Maejima | | |
| 11,087,800 | B1 * | 8/2021 | Yabe | H10B 41/27 | |
| 11,227,861 | B2 | 1/2022 | Fujisawa et al. | | |
| 2002/0172070 | A1 * | 11/2002 | Arimoto | G11C 8/14 | |
| | | | | 257/E21.654 | |

(Continued)

FOREIGN PATENT DOCUMENTS

KR 10-2006-0075401 A 7/2006

*Primary Examiner* — Michael T Tran
(74) *Attorney, Agent, or Firm* — Muir Patent Law, PLLC

(57) ABSTRACT

A memory device includes a memory cell array, a sense amplifier, a voltage generation circuit and a control circuit. The memory cell array includes a plurality of bit lines to which a plurality of memory cells are connected, and a shielding bit line arranged between the plurality of bit lines and on lower portions of the plurality of bit lines. The sense amplifier is configured to sense and amplify data stored in a memory cell selected from among the plurality of memory cells. The voltage generation circuit is configured to generate a bit line precharge voltage and an internal power voltage based on a power voltage of the memory device. The control circuit is configured to selectively provide the shielding bit line with the bit line precharge voltage or the internal power voltage.

20 Claims, 16 Drawing Sheets

(56) References Cited

U.S. PATENT DOCUMENTS

| | | | | |
|---|---|---|---|---|
| 2005/0128844 | A1 * | 6/2005 | Yamagami | G11C 7/06 365/207 |
| 2008/0144378 | A1 * | 6/2008 | Park | G11C 16/3427 365/185.05 |
| 2009/0168542 | A1 * | 7/2009 | Hamada | G11C 16/34 365/185.25 |
| 2012/0063241 | A1 * | 3/2012 | Kajigaya | G11C 11/4097 365/189.04 |
| 2012/0113736 | A1 * | 5/2012 | Kajigaya | G11C 11/406 365/207 |
| 2013/0250646 | A1 * | 9/2013 | Iida | G11C 7/18 365/72 |
| 2019/0067374 | A1 * | 2/2019 | Franca-Neto | H10B 63/34 |
| 2021/0035647 | A1 | 2/2021 | Senoo et al. | |
| 2022/0351790 | A1 | 11/2022 | Hsu | |
| 2022/0367473 | A1 * | 11/2022 | Sakui | G11C 11/406 |
| 2022/0383913 | A1 * | 12/2022 | Guntoro | G11C 7/1036 |
| 2022/0399053 | A1 * | 12/2022 | Lee | G11C 11/4097 |
| 2023/0023505 | A1 * | 1/2023 | Lee | G11C 7/067 |
| 2023/0078539 | A1 * | 3/2023 | Song | G11C 7/065 365/185.21 |
| 2023/0121199 | A1 * | 4/2023 | Cho | G11C 11/4091 365/185.21 |
| 2023/0206990 | A1 * | 6/2023 | Schreck | G11C 11/4091 365/207 |

* cited by examiner

MEMORY DEVICE FOR CONTROLLING SHIELDING BIT LINES

CROSS-REFERENCE TO RELATED APPLICATION(S)

This application is based on and claims priority under 35 U.S.C. § 119 to Korean Patent Application No. 10-2023-0151035, filed on Nov. 3, 2023, in the Korean Intellectual Property Office, the disclosure of which is incorporated by reference herein in its entirety.

BACKGROUND

The inventive concept relates to a semiconductor memory device, and more particularly, to memory devices for controlling shielding bit lines.

Semiconductor chips are made through semiconductor manufacturing processes, and then are tested by test equipment in a wafer, die, or package state. Through the test, defective parts or defective chips are filtered. A semiconductor chip such as a dynamic random access memory (DRAM) has an increasing possibility of errors occurring during manufacturing processes, as progress for fine processes continues. As a DRAM is highly integrated, vertical channel transistors that are formed vertically on a semiconductor substrate, rather than planar channel transistors formed horizontally on the semiconductor substrate, are being introduced in order to highly integrate memory cells. In a DRAM including vertical channel transistors, shielding bit lines may be formed in a memory cell array in order to reduce coupling noise between bit lines.

A memory system may expect to obtain reliability availability and serviceability (RAS) functions with respect to DRAM. A DRAM may perform a repair operation, in which defective memory cell(s) are detected in a test operation with respect to a memory cell array and the defective memory cell(s) are replaced with redundant memory cell(s). In a DRAM, when a reading operation or a refresh operation is performed, a sense amplifier may sense and amplify a voltage difference between a bit line and a complementary bit line. Semiconductor devices forming a sense amplifier may have different characteristics, e.g., threshold voltages, due to a process variation, temperature, etc. As such, a sensing margin of the sense amplifier is reduced, and then, accuracy degrades and performance of the DRAM may deteriorate. Accordingly, a method of improving stability and accuracy of a sense amplifier by controlling shielding bit lines is necessary.

SUMMARY

The inventive concept provides memory devices for controlling shielding bit lines.

According to an aspect of the inventive concept, there is provided a memory device including a memory cell array, including a plurality of bit lines to which a plurality of memory cells are connected, and a shielding bit line arranged between the plurality of bit lines and on lower portions of the plurality of bit lines, a sense amplifier connected between a first sensing driving signal line and a second sensing driving signal line, and configured to sense and amplify data stored in a memory cell selected from among the plurality of memory cells, a voltage generation circuit configured to generate a bit line precharge voltage and an internal power voltage based on a power voltage of the memory device, and a control circuit configured to selectively provide the shielding bit line with the bit line precharge voltage or the internal power voltage. A level of the internal power voltage may be greater than a level of the bit line precharge voltage.

According to an aspect of the inventive concept, provided is a memory device including a memory cell array, a voltage generation circuit and a control circuit. The memory cell array includes a normal region in which a plurality of bit lines to which a plurality of memory cells are connected are arranged and a redundancy region in which redundant bit lines are arranged. Some bit lines of the plurality of bit lines includes defective memory cells being set as a repair unit replaced with the redundant bit lines. The memory cell array includes a first shielding bit line arranged between first bit lines of the plurality of bit lines corresponding to a first repair unit and arranged on lower portions of the first bit lines, a second shielding bit line arranged between second bit lines of the plurality of bit lines corresponding to a second repair unit and arranged on lower portions of the second bit lines, and a third shielding bit line arranged between the redundant bit lines and on lower portions of the redundant bit lines. The voltage generation circuit is configured to generate a bit line precharge voltage and an internal power voltage based on a power voltage of the memory device. The control circuit is configured to, based on a memory cell selected from among the plurality of memory cells being connected to one of the first bit lines: electrically connect the voltage generation circuit to the first shielding bit line and selectively provide the first shielding bit line with a bit line precharge voltage or an internal power voltage. A level of the internal power voltage is greater than a level of the bit line precharge voltage.

According to an aspect of the inventive concept, provided is a memory device including a memory cell array, a voltage generation circuit and a control circuit. The memory cell array includes a plurality of bit lines to which a plurality of memory cells are connected, and shielding bit lines arranged between the plurality of bit lines and on lower portions of the plurality of bit lines, the shielding bit lines being provided with a plurality of bodies. The voltage generation circuit is configured to generate a bit line precharge voltage and an internal power voltage based on a power voltage of the memory device. The control circuit includes a plurality of switches that are adaptively electrically connected to the plurality of bodies of the shielding bit lines, respectively. The control circuit is configured to selectively provide the bit line precharge voltage, the internal power voltage, or a ground voltage to each of the plurality of bodies of the shielding bit lines in response to the plurality of switches being turned on or turned off, and allow each of the plurality of bodies of the shielding bit lines to be in a floating status. A level of the internal power voltage may be greater than a level of the bit line precharge voltage.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
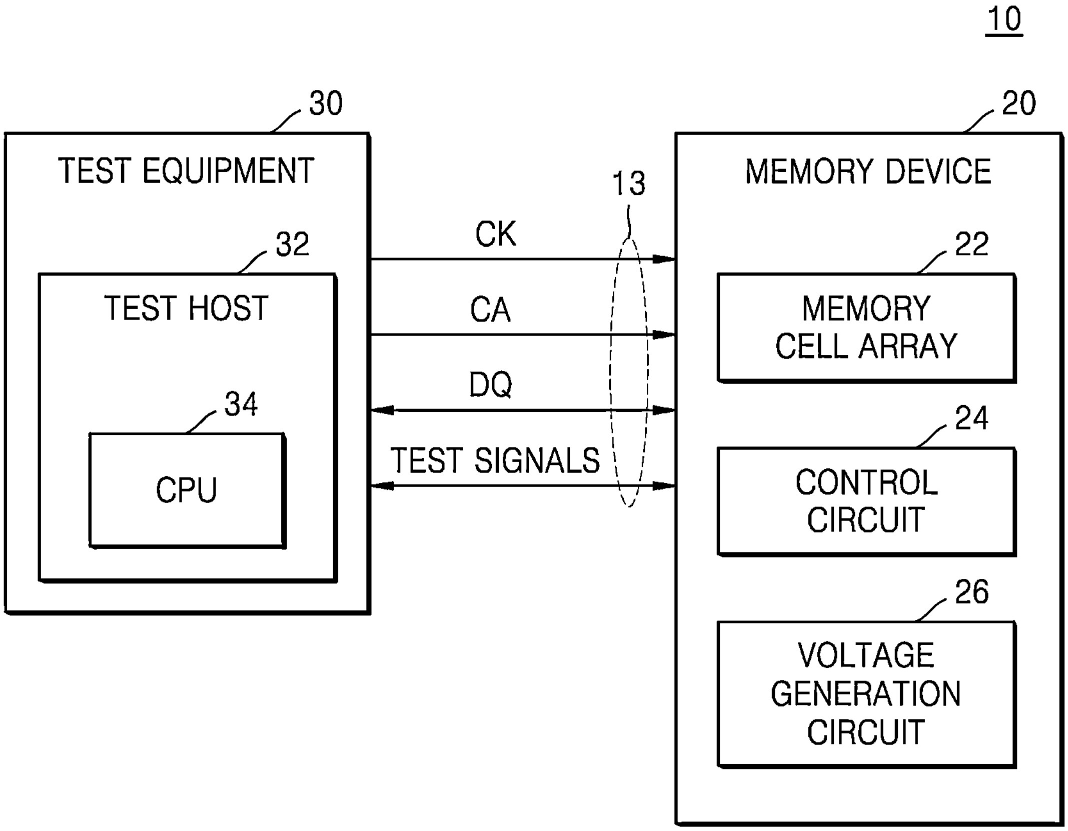
FIG. 1 is a conceptual diagram showing a test system for testing a memory device according to example embodiments.
Figure 2:
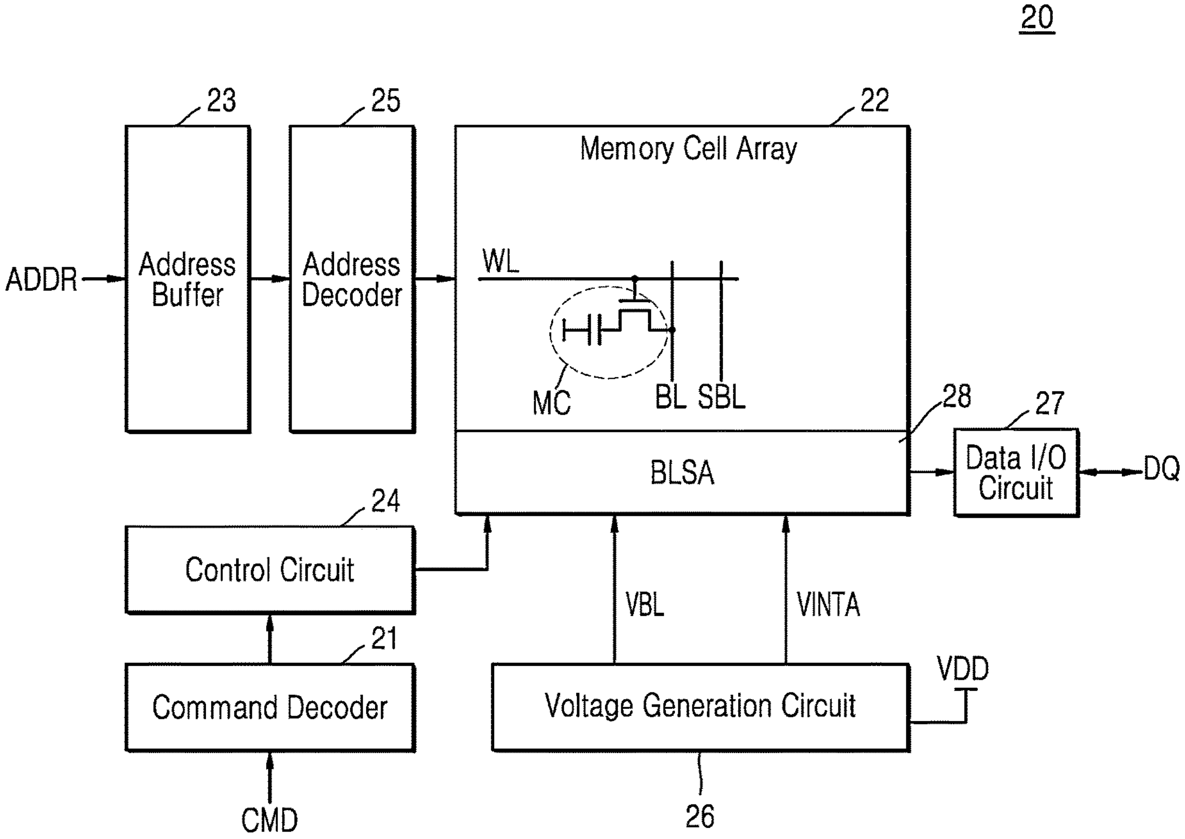
FIG. 2 is a diagram for illustrating the memory device of FIG. 1 according to example embodiments.

FIG. 1 is a conceptual diagram showing a test system 10 for testing a memory device 20 according to example embodiments. FIG. 2 is a diagram for illustrating the memory device 20 of FIG. 1 according to example embodiments.

Referring to FIG. 1 and FIG. 2, a method of testing the memory device 20 by test equipment 30 in a test system 10 is shown. The test equipment 30 may include a test host 32 for testing the memory device 20 that is a device under test (DUT). The test host 32 may include a central processing unit (CPU) 34 for controlling hardware, software, and firmware so as to perform test operations on the memory device 20. The test host 32 may transfer test signals from the CPU 34 to the memory device 20 or may transfer execution result values with respect to the test signals, output from the memory device 20 to the CPU 34.

The test host 32 may be implemented as a test program. The test program may include a test algorithm or pattern for performing test operations. For example, the test host 32 stores certain data on a storage region of the DUT, that is, a memory cell array 22 of the memory device 20, reads the data, and then, may determine pass or fail of the test operations according to whether the read data is the same as the certain data. The test host 32 may test whether a variation range is within an allowable range by measuring variations in voltage/current/frequency with respect to the memory device 20 under various driving conditions. The test host 32 may test a certain circuit operation of the memory device 20, and in particular, may detect defective memory cell(s) by testing the memory cell array 22.

The memory device 20 may be implemented as a DRAM, but is not limited thereto. For example, the memory device 20 may correspond to a double data rate synchronous DRAM (DDR SDRAM), a lower power double data rate (LPDDR) SDRAM, a graphics double data rate (GDDR) SDRAM, a Rambus DRAM (RDRAM), etc. Alternatively, the memory device 20 may be implemented as a static RAM (SRAM), a high bandwidth memory (HBM), or a processor-in-memory (PIM).

In some embodiments, the memory device 20 may be implemented as a non-volatile memory. For example, the memory device 20 may be implemented as a flash memory or a resistive memory such as a phase change RAM (PRAM), magnetic RAM (MRAM), resistive RAM (RRAM), etc.

The test host 32 may test the memory device 20 via a channel 13. The channel 13 may include a bus and/or signal lines that physically or electrically connect the test host 32 to the memory device 20. For example, a clock CK is received by the memory device 20 via a clock bus, a command and address CA are received by the memory device 20 via a command/address bus, and data DQ may be provided between the test host 32 and the memory device 20 via a data bus. Also, the test signals may be provided between the test host 32 and the memory device 20 via test signal lines. For brevity of the drawings, it is shown that the signal is transferred between the test host 32 and the memory device 20 via one signal line or bus, but each bus may include one or more signal lines through which the signals are provided.

The test host 32 may provide the memory 20 with commands in order to test memory operations. Non-limited examples of the command may include an access command for accessing memory, for example, a read command for performing a reading operation and a write command for performing a writing operation, mode register write and read commands for performing writing and reading operations on a mode register, a repair command, etc.

During the test, when the test host 32 provides the memory device 20 with the write command and related addresses, the memory device 20 receives the write command and the related addresses and performs the writing operation to write the write data received from the test host 32 on a memory location corresponding to the related address. The write data is provided to the memory device 20 by the test host 32 according to a timing related to the reception of the write command. For example, the timing may be based on a write latency (WL) value indicating the number of clock cycles after the write command, when the write data is provided to the memory device 20 from the test host 32. The WL value may be programmed on a mode register set (MRS) of the memory device 20 by the test host 32. As well known in the art, the MRS of the memory device 20 may be programmed with information for selecting a feature for setting various operation modes and/or memory operations. In addition, the information for the test operations of the memory device 20 may be stored in a test mode register set (TMRS).

During the test, when a read command and related address are provided to the memory device 20 from the test host 32, the memory device 20 receives the read command and the related address and may perform the reading operation to output the read data from a memory location corresponding to the related address. The read data may be provided to the test host 32 from the memory device 20 according to a timing related to the reception of the read command. For example, the timing may be based on a read latency (RL) value indicating the number of clock cycles after the read command, when the read data is provided to the test host 32 from the memory device 20. The RL value may be set on the memory device 20 by the test host 32. For example, the RL value may be programmed on the MRS of the memory device 20.

The test host 32 may provide the memory device 20 with a repair command and a defective address. The repair command is a command for directing the defective address detected by the memory device 20 to be stored in a non-volatile memory (e.g., a fuse array) in the memory device 20 and a repair operation to be performed on the defective address. The memory device 20 may perform the repair operation so that a defective word line selected by the defective address is replaced with a redundant word line or a defective bit line selected by the defective address is replaced with a redundant bit line, in response to the repair command.

The memory device 20 may include a command decoder 21, a memory cell array 22, an address buffer 23, a control circuit 24, an address decoder 25, a voltage generation circuit 26, a data input/output circuit 27, and a sense amplifier 28. In an embodiment, the sense amplifier 28 may include a bit line sense amplifier.

The memory cell array 22 may include a plurality of rows, a plurality of columns, and a plurality of memory cells MC formed on points where the rows and columns intersect each other. Each memory cell MC includes a cell transistor and a cell capacitor. For example, the cell transistor may be implemented as a vertical channel transistor. A gate of the cell transistor is connected to one of word lines WL that are arranged in a first direction of the memory cell array 22. An end of the cell transistor is connected to one of bit lines BL arranged in a second direction crossing the first direction of the memory cell array 22. The other end of the cell transistor is connected to the cell capacitor. The cell capacitor may store charges of a capacity corresponding to the data status.

The memory cell array 22 may include redundant rows and/or redundant columns to which redundant memory cells for repairing defective memory cells are connected, when defects or errors occur in the memory cells MC. During the repairing operation, when the row or column including the memory cell in which the defect occurs is replaced with a redundant row or redundant column, the replacement may be performed in units of a plurality of rows (e.g., two or four word lines) or a plurality of columns (e.g., four or eight bit lines). For example, when eight bit lines including the defective memory cell are replaced with eight redundant bit lines, it denotes that eight bit lines become a repair unit (see FIG. 12). The above example is provided only for appreciation and does not limit the inventive concept.

In some embodiments, the memory cell array 22 may include a shielding bit line SBL that is arranged between the bit lines BL and throughout the lower portions of the bit lines BL. In an embodiment, the shielding bit line SBL may be arranged between complementary bit lines BLB and throughout the lower portions of the complementary bit lines BLB. The shielding bit line SBL may reduce coupling noise between adjacent bit lines BL and between adjacent complementary bit lines BLB. The shielding bit line SBL may be configured as one body (see FIG. 11). In another embodiment, the shielding bit line SBL of the memory cell array 22 may include a plurality of bodies. The shielding bit line SBL may be formed of a plurality of bodies corresponding to (being dependent upon) the repair operation performed on the memory cell array 22. In response to eight bit lines, that is, example repair unit, the shielding bit line SBL may include a plurality of bodies integrated with respect to every eight bit lines (see FIG. 12). The above example is provided only for appreciation and does not limit the inventive concept.

The command decoder 21 may determine the command CMD input thereto, with reference to operands (variables, fields, or values indicating certain aspects of the command) provided to the memory device 20. The command decoder 21 may be configured to perform internal operations corresponding to the command CMD. The command CMD may include an active command, a read command, a write command, a precharge command, a repair command, etc.

The address buffer 23 may receive an address ADDR provided to the memory device 20. The address ADDR may include a row address addressing the word line WL of the memory cell array 22 and a column address addressing the bit line BL of the memory cell array 22. The address buffer 23 may transfer each of the row address and the column address to the address decoder 25.

The address decoder 25 may include a row decoder and a column decoder that select the word line WL and the bit line BL of the memory cell MC that is to be accessed in response to the received address ADDR. The row decoder may enable or activate the word line WL of the memory cell MC corresponding to the row address by decoding the row address. The column decoder may provide a column selection signal for selecting the bit line BL of the memory cell MC corresponding to the column address by decoding the column address.

The control circuit 24 may generate internal control signals according to the command CMD from the command decoder 21, and may control the shielding bit line SBL and/or the sense amplifier 28. The control circuit 24 may control the sense amplifier 28 to sequentially perform an offset compensation operation, a charge sharing operation, a sensing operation, and a precharging operation, when the sense amplifier 28 senses and amplifies the data statue of the memory cell MC. The data sensed and amplified by the sense amplifier 28 may be transferred to the data input/output circuit 27 that is to be configured to output data to an external device of the memory device 20 via data DQ pad(s).

The data input/output circuit 27 may receive the data DQ to be written on the memory cells MC from the external device and transfer the data to the memory cell array 22. The data input/output circuit 27 may output the data sensed and amplified by the sense amplifier 28 to the external device via the data DQ pad(s) as read data.

The voltage generation circuit 26 may generate a bit line precharge voltage VBL and internal power voltage VINTA provided to the sense amplifier 28 based on a power voltage VDD of the memory device 20. In some embodiments, a level of the bit line precharge voltage VBL may be set to be half the internal power voltage VINTA. Each of the voltages VBL and VINTA generated from the voltage generation circuit 26 may be used in operations performed by the shielding bit lines SBL and/or the sense amplifier 28 according to the control from the control circuit 24.

Figure 3:
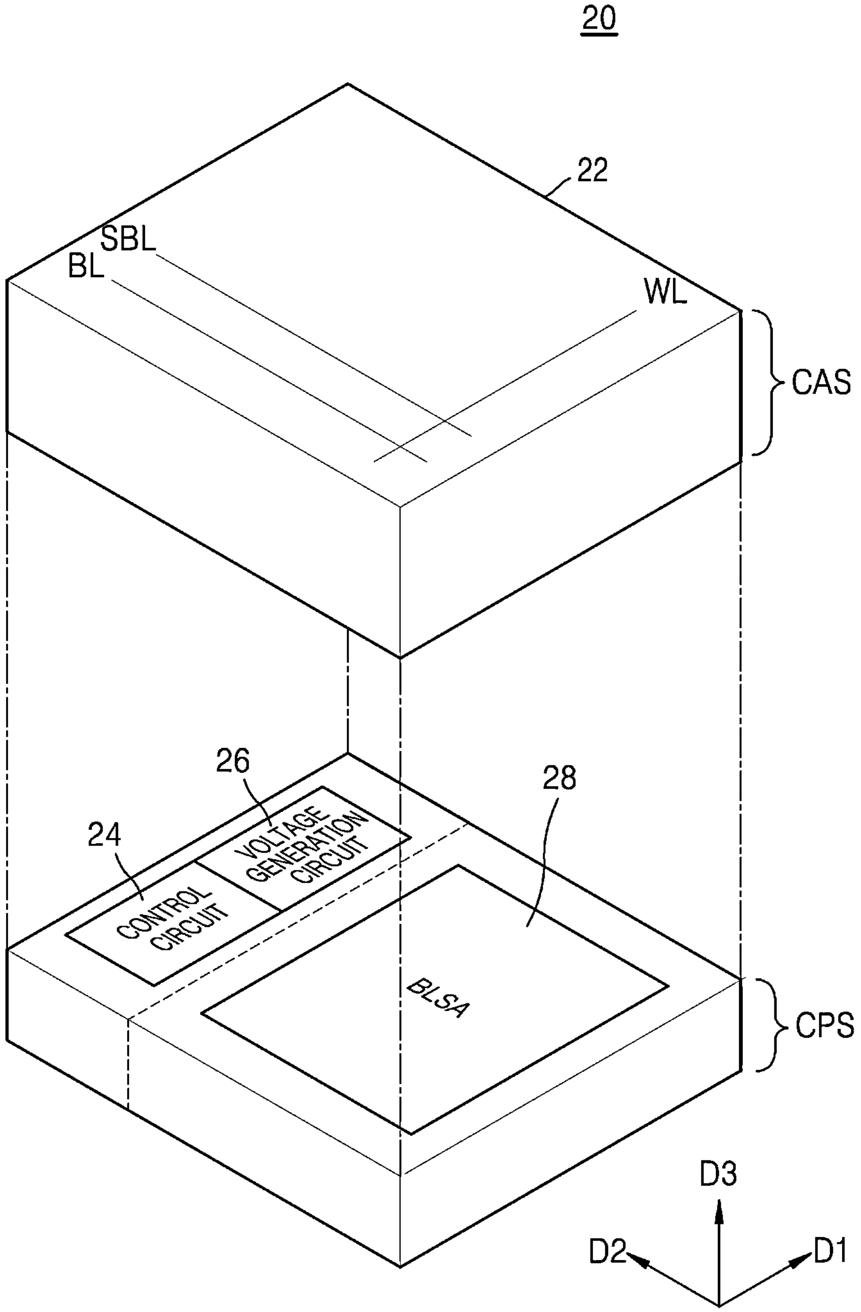
FIGS. 3, 4, 5, and 6 are diagrams for illustrating a structure of a memory device according to example embodiments.
Figure 4:
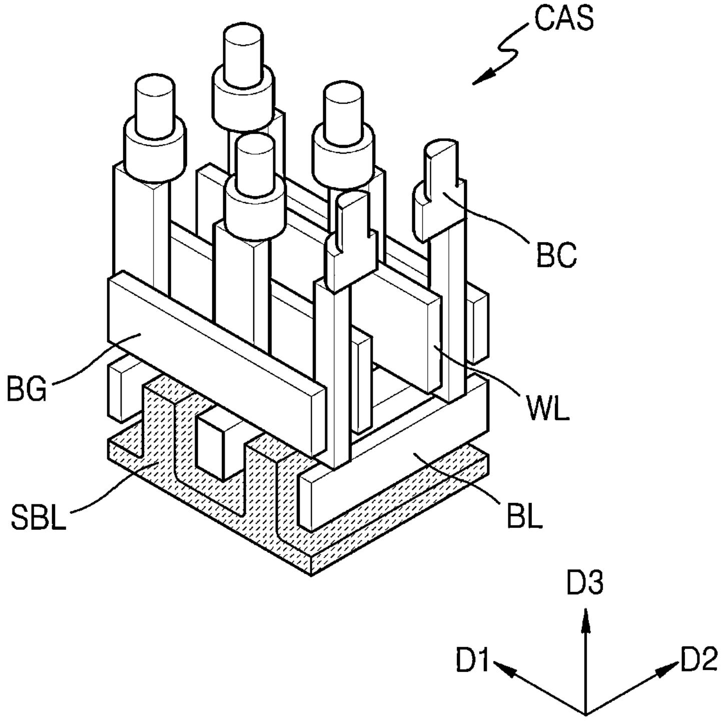
Figure 5:
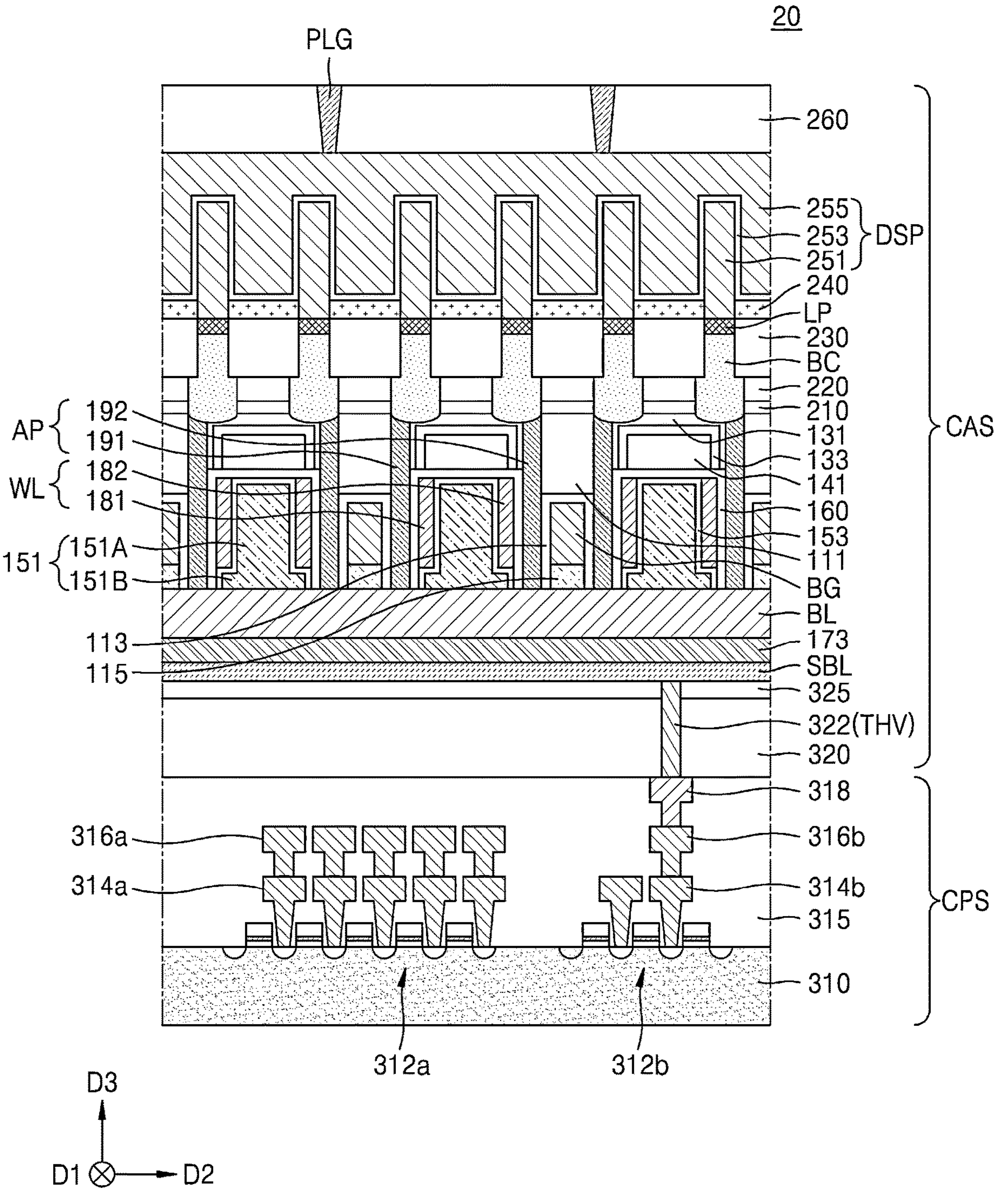
Figure 6:
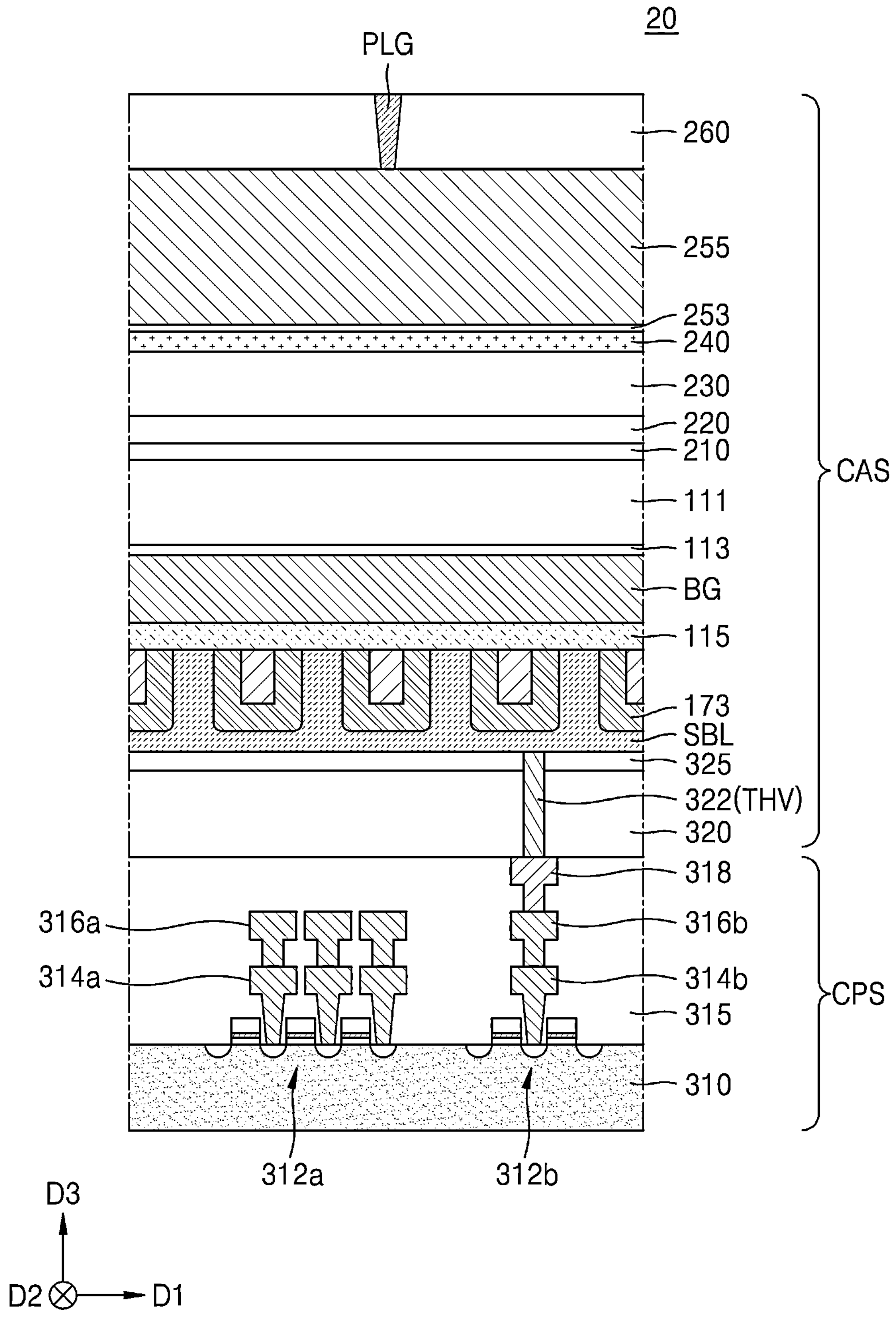

FIGS. 3, 4, 5, and 6 are diagrams for illustrating a structure of a memory device 20 according to example embodiments. FIG. 4 is a perspective view of the memory device 20 of FIG. 2. FIG. 5 is a cross-sectional view showing a cut surface cut along a line corresponding to a second direction D2 in the perspective view of the memory device shown in FIG. 4, and FIG. 6 is a cross-sectional view showing a cut surface cut along a line corresponding to a first direction D1. For convenience of description, upper/lower surfaces, upper/lower portions, up/down, etc. are described based on the directions in the drawings. Therefore, even one surface may be referred to as both an upper surface and a lower surface according to the direction shown in the drawings.

Referring to FIGS. 2 and 3, the memory device 20 may include a cell array structure CAS and a core peripheral circuit structure CPS overlapping each other in a third direction D3. The cell array structure CAS may include the memory cell array 22. The core peripheral circuit structure CPS may include a core peripheral circuit including the command decoder 21, the address buffer 23, the address decoder 25, the control circuit 24, the sense amplifier 28, the data input/output circuit 27, and the voltage generation circuit 26. Accordingly, the memory device 20 may have a structure, in which the memory cell array 22 is arranged on the upper portion of the core peripheral circuit, that is, a cell over periphery (COP) structure.

The cell array structure CAS may include a plurality of memory blocks. Each of the plurality of memory blocks may include a plurality of memory cells including a vertical channel transistor (VCT). In the cell array structure CAS, the plurality of word lines WL may extend in the first direction D1, and the plurality of bit lines BL may extend in the second direction D2.

The core peripheral circuit structure CPS may include a semiconductor substrate, and semiconductor devices such as transistors and patterns for wiring semiconductor devices are formed on the semiconductor substrate to form the core peripheral circuit. After forming the core peripheral circuit in the core peripheral circuit structure CPS, the cell array structure CAS including the memory cell array 22 may be formed, and patterns for electrically connecting the word lines WL, the bit lines BL, and the shielding bit lines SBL of the memory cell array 22 to the core peripheral circuit formed in the core peripheral circuit structure CPS may be formed. For example, the core peripheral circuit structure CPS may have the sense amplifier 28, the control circuit 24, and the voltage generation circuit 26 arranged thereon.

Referring to FIGS. 4, 5, and 6, the core peripheral circuit structure CPS may include a lower substrate 310, an interlayer insulating layer 315, a plurality of circuit elements 312*a* and 312*b* formed on the lower substrate 310, first metal layers 314*a* and 314*b* connected respectively to the plurality of circuit elements 312*a* and 312*b*, second metal layers 316*a* and 316*b* formed on the first metal layers 314*a* and 314*b*, and a metal pattern 318 formed as the uppermost metal layer of the core peripheral circuit structure CPS. In an embodiment, the first metal layers 314*a* and 314*b* may be formed of tungsten having a relatively high resistance, and the second metal layers 316*a* and 316*b* may be formed of copper having a relatively low resistance.

In the specification, the first metal layers 314*a* and 314*b* and the second metal layers 316*a* and 316*b* are only shown and described, but the embodiments are not limited thereto, that is, at least one metal layer may be further formed on the second metal layers 316*a* and 316*b*. At least a part of the at least one metal layer formed on the second metal layers 316*a* and 316*b* may be formed of aluminum, etc., having lower resistance than the copper included in the second metal layers 316*a* and 316*b*. The interlayer insulating layer 315 is arranged on the lower substrate 310 so as to cover the plurality of circuit elements 312*a* and 312*b*, the first metal layers 314*a* and 314*b*, and the second metal layers 316*a* and 316*b*, and may include an insulating material such as silicon oxide, silicon nitride, etc.

The plurality of circuit elements 312*a* and 312*b* may be connected to at least one of circuit elements configuring the peripheral circuit. For convenience of description, the first circuit element 312*a* may represent one of the plurality of transistors in the sense amplifier 28 described with reference to FIG. 3, and the second circuit element 312*b* may represent the transistors configuring the control circuit 24 or the voltage generation circuit 26.

In the memory device 20, the bit lines BL may be arranged on an upper substrate 320 to be spaced apart from one another in the first direction D1. The bit lines BL may be spaced apart from one another in the first direction D1 and may extend in the second direction D2 crossing the first direction D1. Active patterns AP may be alternately arranged on each of the bit lines BL in the second direction D2. The active patterns AP may be spaced apart a certain distance from one another in the first direction D1. That is, the active patterns AP may be two-dimensionally arranged in the first direction D1 and the second direction D2 crossing each other. In some embodiments, the plurality of word lines WL, the plurality of bit lines BL, and the plurality of active patterns AP form a plurality of vertical channel transistors.

Each of the active patterns AP may have a length in the first direction D1, a width in the second direction D2, and a height in a third direction D3 perpendicular to the upper substrate 320. Each of the active patterns AP may have the substantially uniform width. Each of the active patterns AP may have an upper surface and a lower surface facing each other in the third direction D3. For example, the lower surfaces of the active patterns AP may come into contact with the bit lines BL.

Each of the active patterns AP may include a source region adjacent to the bit line BL, a drain region adjacent to a contact pattern BC, and a channel region between the source region and the drain region. The channel region of the active pattern AP may be controlled by the word lines WL and back gate electrodes BG when the memory device 20 operates. The active patterns AP may include, for example, single-crystalline silicon (Si), in order to improve leakage current characteristic when the memory device 20 operates.

The back gate electrodes BG may be spaced apart a certain distance from one another on the bit lines BL in the second direction D2. The back gate electrodes BG may extend in the first direction D1 across the bit lines BL.

Each of the back gate electrodes BG may be arranged between adjacent active patterns AP in the second direction D2. A first active pattern 191 may be arranged on one side of each back gate electrode BG and a second active pattern 192 may be arranged on the other side of each back gate electrode BG. The back gate electrodes BG may have a height less than the height of the active patterns AP in the vertical direction.

When the memory device 20 operates, a negative voltage may be applied to the back gate electrodes BG and a threshold voltage of the vertical channel transistor may be increased. This denotes that the decrease in threshold voltage according to miniaturization of the vertical channel transistor and degradation in the leakage current characteristic are prevented.

A first insulating pattern 111 may be arranged between adjacent active patterns AP in the second direction D2. The first insulating pattern 111 may extend in the first direction D1 in parallel with the back gate electrodes BG. A back gate insulating layer 113 may be arranged between each back gate electrode BG and the active pattern AP and between the back gate electrode BG and the first insulating pattern 111. The back gate insulating layer 113 may include vertical portions covering both side surfaces of the back gate electrode BG and horizontal portions connecting the vertical portions of the back gate insulating layer 113. The horizontal portion of the back gate insulating layer 113 may be closer to the contact pattern BC than the bit line BL, and may cover the upper surface of the back gate electrode BG. A back gate capping pattern 115 may be arranged between the bit lines BL and the back gate electrode BG. The back gate capping pattern 115 may include an insulating material, and the lower surface of the back gate capping pattern 115 may come into contact with the bit lines BL. The back gate capping pattern 115 may be arranged between the vertical portions of the back gate insulating layer 113.

The word lines WL may extend on the bit lines BL in the first direction D1 and may be alternately arranged in the second direction D2. From among the word lines WL, a first word line 181 may be arranged at one side of the first active pattern 191, and a second word line 182 may be arranged at one side of the second active pattern 192. A part of the first word line 181 may be arranged between the first active patterns 191 adjacent to each other in the first direction D1, and a part of the second word line 182 may be arranged between the second active patterns 192 adjacent to each other in the first direction D1.

The word lines WL may be vertically spaced apart from the bit lines BL and the contact patterns BC. The word lines WL may be located between the bit lines BL and the contact patterns BC when seen vertically. The word lines WL adjacent to each other may have side walls facing each other. The word lines WL may have a height less than that of the active patterns AP in the vertical direction. The height of the word lines WL may be equal to or greater than that of the back gate electrodes BG in the third direction D3.

The gate insulating layers 160 may be arranged between the word lines WL and the active patterns AP. The gate insulating layers 160 may extend in the first direction D1 in parallel with the word lines WL. The gate insulating layers 160 may cover one side surface of the first active pattern 191 and the other side surface of the second active pattern 192. The gate insulating layer 160 may have substantially uniform thickness. A second insulating pattern 141 may be arranged between the gate insulating layer 160 and the contact patterns BC. For example, the second insulating pattern 141 may include silicon oxide. A first etch-stop layer 131 and a second etch-stop layer 133 may be arranged between the active patterns AP and the second insulating pattern 141.

The word lines WL may be isolated from each other by third insulating patterns 151 on the gate insulating layer 160. The third insulating pattern 151 may extend in the first direction D1 between the word lines WL. A first capping layer 153 may be arranged between the third insulating pattern 151 and the word lines WL. The first capping layer 153 may have substantially uniform thickness. The third insulating pattern 151 may include a third vertical pattern 151A and a third horizontal pattern 151B.

The contact patterns BC may be respectively connected to the active patterns AP through a third etch-stop layer 210 and an interlayer insulating layer 220. For example, the contact patterns BC may be respectively connected to the drain regions of the active patterns AP. The contact patterns BC may each have a lower width that is greater than an upper width. The contact patterns BC adjacent to each other may be isolated by separation dielectric patterns 230. Each of the contact patterns BC may have various shapes such as a circular shape, an elliptical shape, a rectangular shape, a square shape, a hexagonal shape, etc. in a planar point of view. Landing pads LP may be arranged on the contact patterns BC.

The separation dielectric patterns 230 may be arranged between the landing pads LP. The landing pads LP may be arranged in a matrix type in the first direction D1 and the second direction D2, when seen on a plane. Upper surfaces of the landing pads LP may be substantially co-planar with the upper surfaces of the separation dielectric patterns 230. A fourth etch-stop layer 240 may be formed on the separation dielectric patterns 230.

Data storage patterns DSP may be arranged on the landing pads LP. The data storage patterns DSP may be electrically connected to the active patterns AP, respectively. The data storage patterns DSP may be arranged in a matrix type in the first direction D1 and the second direction D2. The data storage patterns DSP may completely or partially overlap the landing pads LP. The data storage patterns DSP may entirely or partially come into contact with the upper surfaces of the landing pads LP. An upper insulating layer 260 may be disposed on the data storage patterns DSP, and cell contact plugs PLG may be connected to a plate electrode 255 through the upper insulating layer 260.

In some embodiments, the data storage patterns DSP may be capacitors, and may include a capacitor dielectric layer 253 disposed between storage electrodes 251 and the plate electrode 255. In this case, the storage electrodes 251 may directly come into contact with the landing pads LP, and the storage electrode 251 may have various shapes such as a circular shape, an elliptical shape, a rectangular shape, a square shape, a diamond shape, a hexagonal shape, etc. when seen from a plane.

In some embodiments, the data storage patterns DSP may be variable resistive patterns that may be switched into two kinds of resistive states due to an electrical pulse applied to memory elements. For example, the data storage patterns DSP may include, but are not limited to, a phase change material of which the crystalline state is changed according to the current amount, a perovskite compound, a transition metal oxide, a magnetic material, a ferromagnetic material, an antiferromagnetic material, etc. According to the material layer of the data storage patterns DSP, the memory device 20 may be implemented as a resistive memory, e.g., a phase change RAM (PRAM), a magnetic RAM (MRAM), a resistive RAM (RRAM), etc.

The shielding bit lines SBL may be arranged between the bit lines BL and throughout the lower portions of the bit lines BL. The shielding bit line SBL may reduce coupling noise between adjacent bit lines BL. For example, the shielding bit line SBL may include a shielding structure formed of a conductive material. First line insulating layers 173 may be spaced apart from one another in the first direction D1 and may extend in the second direction D2. The first line insulating layers 173 may be formed to come into contact with the facing side walls of the adjacent bit lines BL and to be isolated from one another in the first direction D1. Second line insulating layers 325 may be formed to surround the lower and side surfaces of the shielding bit lines SBL and to fill spaces between the shielding bit line(s) SBL. A through substrate via (e.g., through silicon via (TSV)) 322 extends lengthily in the third direction D3 to the metal pattern 318 formed as the uppermost metal layer of the core peripheral circuit structure CPS through the upper substrate 320 and electrically connects the shielding bit line SBL to the element **312*b* of the control circuit 24**.

In general, the shielding bit line SBL is arranged to reduce the coupling noise between the bit lines BL, but both the bit line BL and the shielding bit line SBL include the conductive material, and thus, the capacitance may increase between the bit lines BL and the shielding bit line SBL. The operating characteristics of the sense amplifier 28 may be improved by using the capacitance between the bit lines BL and the shielding bit line SBL. Hereinafter, components and operations of the shielding bit line SBL and the sense amplifier 28 are described in detail below with reference to example embodiments.

Figure 7:
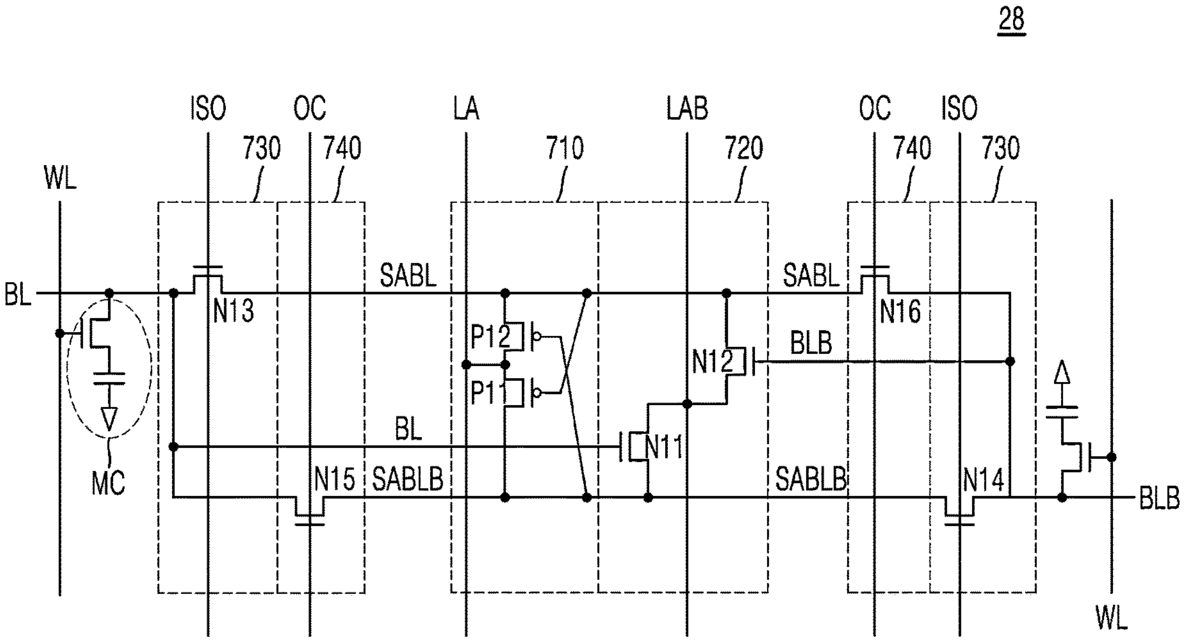
FIG. 7 is a diagram for describing a circuit diagram of a sense amplifier according to example embodiments.

FIG. 7 is a diagram for describing a circuit diagram of a sense amplifier according to example embodiments. In the timing diagrams described below, a transverse axis and a longitudinal axis respectively indicate time and voltage level, and may not be essentially shown in constant ratios.

Referring to FIGS. 2 and 7, the sense amplifier 28 may include a P-type sense amplifier circuit 710 including PMOS transistors, an N-type sense amplifier circuit 720 including NMOS transistors, an isolation circuit 730, and an offset cancellation circuit 740. For convenience of description, the P-type sense amplifier circuit 710 is referred to as a first sense amplifier circuit, and the term of the P-type sense amplifier circuit 710 and the term of the first sense amplifier circuit may be interchangeably used. The N-type sense amplifier circuit 720 is referred to as a second sense amplifier circuit, and the term of the N-type sense amplifier circuit 720 and the term of the second sense amplifier circuit may be interchangeably used. In addition, a mismatch between threshold voltages of the transistors forming the sense amplifier 28 may be referred to as an offset voltage. Removal of the threshold voltage mismatch may be referred to as compensation for the offset voltage.

The P-type sense amplifier circuit 710 may include a first PMOS transistor P11 and a second PMOS transistor P12 connected to a first sensing driving signal LA line. The first PMOS transistor P11 may be connected between the first sensing driving signal LA line and a complementary sensing bit line SABLB, and the second PMOS transistor P12 may be connected between the first sensing driving signal LA line and a sensing bit line SABL. The sensing bit line SABL may be connected to a gate of the first PMOS transistor P11 and the complementary sensing bit line SABLB may be connected to a gate of the second PMOS transistor P12. The first PMOS transistor P11 and the second PMOS transistor P12 may be designed to have the same size. In some embodiments, the first PMOS transistor P11 and the second PMOS transistor P12 may be designed to have different sizes.

The N-type sense amplifier circuit 720 may include a first NMOS transistor N11 and a second NMOS transistor N12 connected to a second sensing driving signal LAB line. The first NMOS transistor N11 may be connected between the second sensing driving signal LAB line and the complementary sensing bit line SABLB, and the second NMOS transistor N12 may be connected between the second sensing driving signal LAB line and the sensing bit line SABL. The bit line BL is connected to a gate of the first NMOS transistor N11 and the complementary bit line BLB is connected to a gate of the second NMOS transistor N12. The first NMOS transistor N11 and the second NMOS transistor N12 may be designed to have the same size. In some embodiments, the first NMOS transistor N11 and the second NMOS transistor N12 may be designed to have different sizes.

An isolation circuit 730 may include third and fourth NMOS transistors N13 and N14 that operate in response to an isolation signal ISO. The third NMOS transistor N13 may be connected between the bit line BL and the sensing bit line SABL, and the fourth NMOS transistor N14 may be connected between the complementary bit line BLB and the complementary sensing bit line SABLB. The third NMOS transistor N13 and the fourth NMOS transistor N14 may be designed to have the same size. In some embodiments, the third NMOS transistor N13 and the fourth NMOS transistor N14 may be designed to have different sizes.

The offset cancellation circuit 740 may include fifth and sixth NMOS transistors N15 and N16 that operate in response to an offset cancellation signal OC. The fifth NMOS transistor N15 may be connected between the bit line BL and the complementary sensing bit line SABLB, and the sixth NMOS transistor N16 may be connected between the complementary bit line BLB and the sensing bit line SABL. The fifth NMOS transistor N15 and the sixth NMOS transistor N16 may be designed to have the same size. In some embodiments, the fifth NMOS transistor N15 and the sixth NMOS transistor N16 may be designed to have different sizes.

Figure 8A:
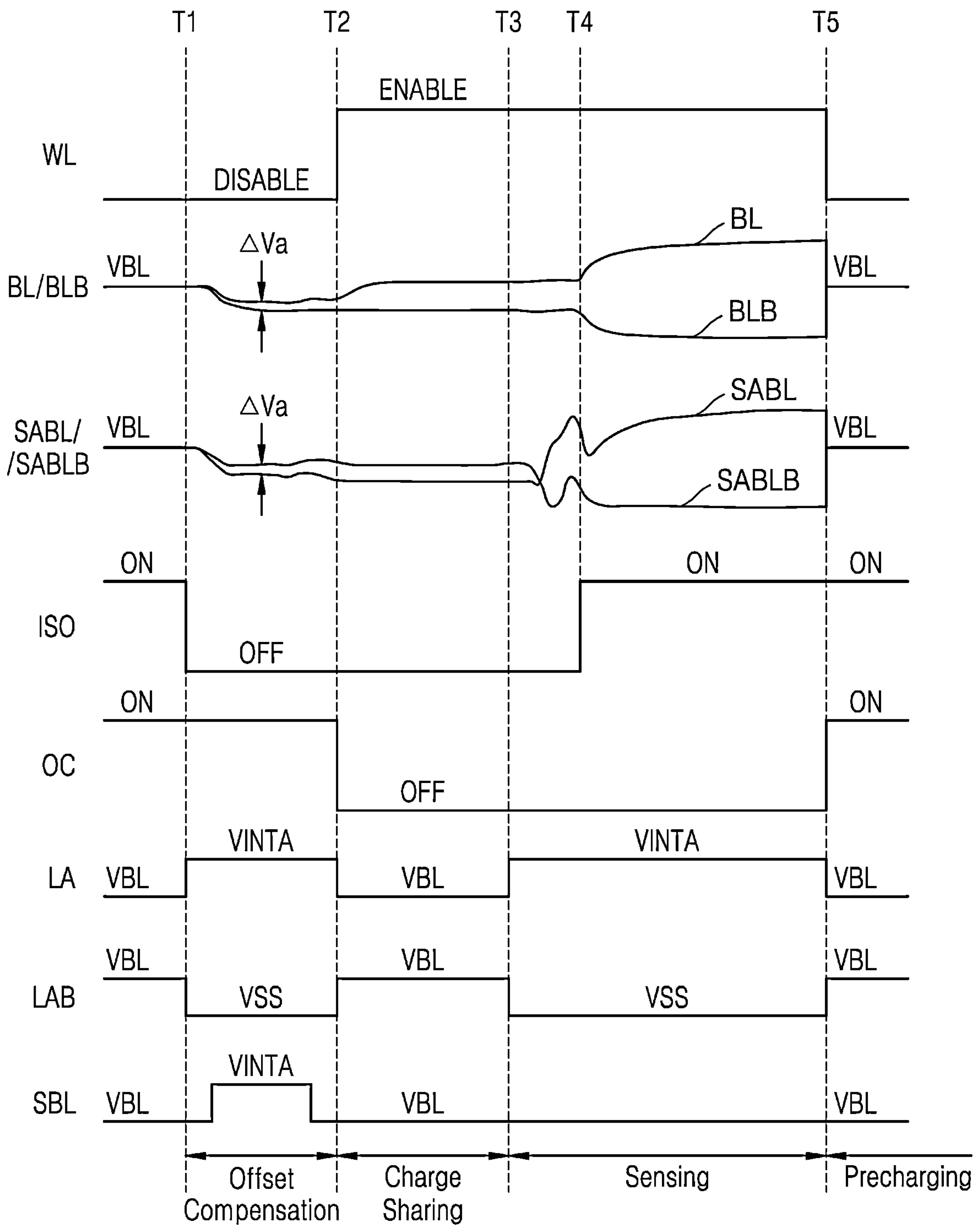
FIGS. 8A and 8B are timing diagrams for describing operations of a sense amplifier according to example embodiments.
Figure 8B:
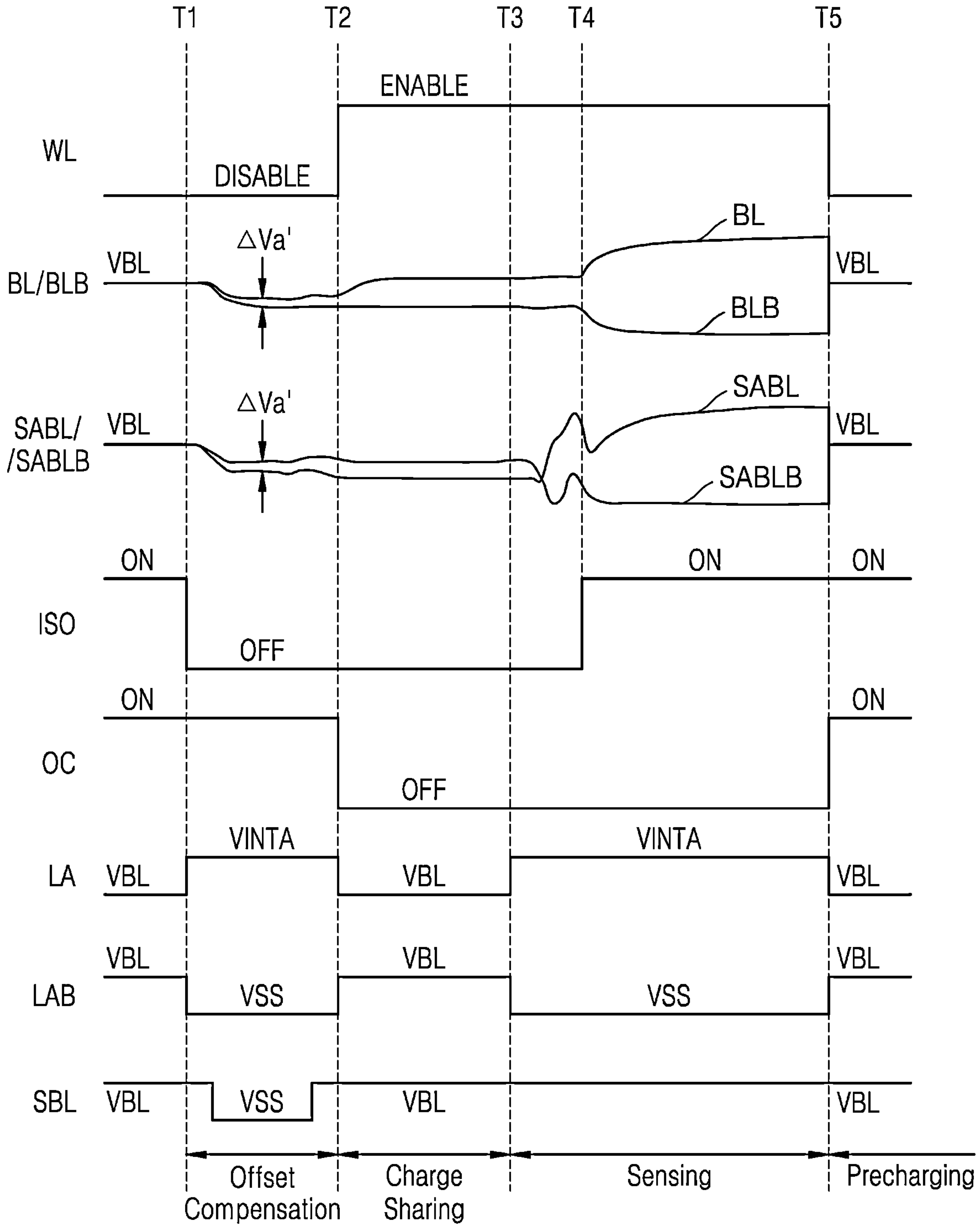

FIGS. 8A and 8B are timing diagrams for describing operations of a sense amplifier according to example embodiments.

Referring to FIG. 8A, an offset compensation operation may be performed between a point in time T1 and a point in time T2. The word line WL may be in a disabled state, the third and fourth NMOS transistors N13 and N14 are in turned-off states due to the isolation signal ISO of a logic-low level (sometimes referred to as OFF), and the fifth and sixth NMOS transistors N15 and N16 may be in turned-on states due to the offset cancellation signal OC of a logic-high level (sometimes referred to as ON). The internal power voltage VINTA is provided to the first sensing driving signal LA line and a ground voltage VSS may be provided to the second sensing driving signal LAB line.

A precharging operation may be performed prior to the point in time T1. The performing of the precharging operation denotes that the bit line BL, the complementary bit line BLB, the sensing bit line SABL, and the complementary sensing bit line SABLB are connected via one node and equalized to the same voltage level due to the isolation signal ISO and the offset cancellation signal OC having the logic-high level. For example, the bit line BL, the complementary bit line BLB, the sensing bit line SABL, and the complementary sensing bit line SABLB may be equalized to a bit line precharge voltage VBL that is provided to an equalizing driving signal line by an equalizing circuit. During the precharging operation, the bit line precharge voltage VBL may be provided to the shielding bit line SBL adjacent to the bit line BL.

Between the point in time T1 and the point in time T2, the bit line BL and the complementary sensing bit line SABLB may be connected to each other and the complementary bit line BLB and the sensing bit line SABL may be connected to each other via the fifth and sixth NMOS transistors N15 and N16 that are turned on by the offset cancellation signal OC of logic-high level. Due to the first and second PMOS transistors P11 and P12 and the first and second NMOS transistors N11 and N12 that are connected the first sensing driving signal LA line to the internal power voltage VINTA and the second sensing driving signal LAB line to the ground voltage VSS, there may be certain voltage differences between the bit line BL and the complementary sensing bit line SABLB and between the complementary bit line BLB and the sensing bit line SABL. For convenience of description, it is assumed that the bit line BL is increased by a certain level as compared with the complementary bit line BLB and the complementary sensing bit line SABLB is increased by a certain level as compared with the sensing bit line SABL.

In some embodiments, in the offset compensation operation between the point in time T1 and the point in time T2, the internal power voltage VINTA may be provided to the shielding bit line SBL adjacent to the bit line BL that is to be sensed and amplified, as shown in FIG. 8A. Because the bit line BL is coupled by the shielding bit line SBL provided the internal power voltage VINTA, the voltage levels of the bit line BL and the complementary sensing bit line SABLB may be increased. The rising of the voltage level of the bit line BL and the complementary sensing bit line SABLB may accelerate differentiation between the certain voltages between the bit line BL and the complementary bit line BLB and between the sensing bit line SABL and the complementary sensing bit line SABLB.

In some embodiments, the transistors of the sense amplifier 28 may have slow operating characteristics due to some issues on semiconductor manufacturing processes. Due to the low operating characteristics of the transistors, the offset compensation operation of the sense amplifier 28 may become slow. In order not to reduce the speed of the offset compensation operation, the internal power voltage VINTA may be provided to the shielding bit line SBL. Providing the entire shielding bit lines SBL in the memory cell array 22 with the internal power voltage VINTA may cause undesirable power consumption exceeding the specification of the low-power memory device 20. In order to optimize the power consumption, the internal power voltage VINTA may be provided only to some bodies, which are related to the sense amplifier 28 of slow operating characteristics, from among the plurality of bodies included in the shielding bit line SBL.

In some embodiments, when the memory device 20 operates under high temperature environment, the operating speed of the memory device 20 needs to be reduced. In the offset compensation operation between the point in time T1 and the point in time T2, the ground voltage VSS may be provided to the shielding bit line SBL adjacent to the bit line BL that is to be sensed and amplified, as shown in FIG. 8B. Because the bit line BL is coupled by the shielding bit line SBL of the ground voltage VSS, the voltage levels of the bit line BL and the complementary sensing bit line SABLB may be descended. The descending of the voltage level of the bit line BL and the complementary sensing bit line SABLB may decelerate differentiation between the certain voltages between the bit line BL and the complementary bit line BLB and between the sensing bit line SABL and the complementary sensing bit line SABLB. On the contrary, when the memory device 20 operates under low temperature environment, the internal power voltage VINTA may be provided to the shielding bit line SBL in order to accelerate the offset compensation operation of the sense amplifier 28 as shown in FIG. 8A.

In the embodiment, the bit line BL is increased to a certain level as compared with the complementary bit line BLB, and thus, it is assumed that the bit line BL and the complementary bit line BLB has a first voltage difference ΔVa. In addition, the complementary sensing bit line SABLB is increased by a certain level as compared with the sensing bit line SABL, it is assumed that the complementary sensing bit line SABLB and the sensing bit line SABL have the first voltage difference ΔVa. The above example is provided only for understanding of the embodiment and does not limit the inventive concept. The first voltage difference ΔVa may be interpreted as a first offset voltage according to a difference between threshold voltages of the first and second PMOS transistors P11 and P12 and a difference between threshold voltages of the first and second NMOS transistors N11 and N12. This denotes that the bit line BL and the complementary bit line BLB are configured to have the difference as much as the first offset voltage, and thus, the offset noise caused due to the difference between the threshold voltages of the first and second PMOS transistors P11 and P12 and the difference between the threshold voltages of the first and second NMOS transistors N11 and N12 is removed. That is, the sense amplifier 28 may compensate for the offset voltage.

In some embodiments, during the offset compensation operation, it may be considered that the bit line BL and the complementary bit line BLB have the first voltage difference ΔVa therebetween, and the first voltage difference ΔVa represents a voltage difference caused due to the timings of some signals (e.g., isolation signal ISO, first sensing driving signal LA, and second sensing driving signal LAB). The above example is provided only for appreciation and does not limit the inventive concept.

Referring to FIG. 8B, the bit line BL is decreased to a certain level as compared with the complementary bit line BLB, and thus, it is assumed that the bit line BL and the complementary bit line BLB has a second voltage difference ΔVa'. In addition, the complementary sensing bit line SABLB is decreased by a certain level as compared with the sensing bit line SABL, it is assumed that the complementary sensing bit line SABLB and the sensing bit line SABL have the second voltage difference ΔVa'. Herein, the second voltage difference ΔVa' may be smaller than the first voltage difference ΔVa.

The objective and meaning of the voltage difference between the bit line BL and the complementary bit line BLB are to remove the offset noise caused due to the difference between the threshold voltages of the transistors P11 and P12 of the P-type sense amplifier circuit 710 and the difference between the threshold voltages of the transistors N11 and N12 of the N-type sense amplifier circuit 720 that are significant in the sensing and amplifying operations of the sense amplifier 28. Accordingly, the sensing operation of the sense amplifier 28 may secure the reliability and accuracy.

A charge sharing operation may be performed between the point in time T2 and a point in time T3. At the point in time T2, the offset cancellation signal OC may be transited to the logic-low level, and then, the fifth and sixth NMOS transistors N15 and N16 are changed to the turned-off states, the bit line precharge voltage VBL may be provided to the first and second sensing driving signal (LA and LAB) lines, and the word lines WL may be activated or enabled. The charge sharing occurs between the cell capacitor and the bit line BL of the memory cell MC connected to the activated word line WL. When data '1' is stored in the memory cell MC, the voltage level of the bit line BL would rise by a certain level during the charge sharing operation. In another embodiment, when data '0' is stored in the memory cell MC, the voltage level of the bit line BL would descend by a certain level during the charge sharing operation.

A sensing operation may be performed between the point in time T3 and a point in time T5. At the point in time T3, the internal power voltage VINTA is provided to the first sensing driving signal LA line and a ground voltage VSS may be provided to the second sensing driving signal LAB line. Based on the voltage difference between the sensing bit line SABL and the complementary sensing bit line SABLB, the complementary bit line SABL may increase to the internal power voltage VINTA level, and the complementary sensing bit line SABLB may descend to the ground voltage VSS level. The point in time T3 may be referred to as a sampling point in time of the sensing operation.

At a point in time T4, the isolation signal ISO is transited to the logic-high level, and then, the third and fourth NMOS transistors N13 and N14 may be changed to the turned-on states. The sensing bit line SABL and the bit line BL may be connected to each other, and the complementary sensing bit line SABLB and the complementary bit line BLB may be connected to each other. The bit line BL may increase to the voltage level of the sensing bit line SABL, and a charge amount corresponding to the voltage level of the bit line BL may be restored in the cell capacitor of the memory cell MC. At the point in time T5, the word line WL may be inactivated, and the first bit line voltage VBL may be provided to the first and second sensing driving signal (LA and LAB) lines.

At the point in time T5, the precharging operation may be performed. The bit line precharge voltage VBL is provided to the first and second sensing driving signal LA and LAB lines, the bit line BL, the complementary bit line BLB, the sensing bit line SABL, and the complementary sensing bit line SABLB are connected via one node due to the isolation signal ISO and the offset cancellation signal OC having logic-high level, and the respective lines may be precharged with the bit line precharge voltage VBL provided to the equalizing driving signal line by the equalizing circuit.

In FIGS. 8A and 8B, from the point in time T1 to the point in time T2, the offset compensation operation performed by the sense amplifier 28 in relation to the internal power voltage VINTA and the ground voltage VSS provided to the shielding bit line SBL. The charge sharing operation is performed from the point in time T2 to the point in time T3, the sensing operation is performed from the point in time T3 to the point in time T5, and the precharging operation is performed at the point in time T5. The above example is provided only for understanding of the embodiment and does not limit the inventive concept. The charge sharing operation and the sensing operation performed in relation to the level of voltage provided to the shielding bit line SBL are described with reference to FIGS. 9A, 9B, 10A, and 10B, and redundant descriptions provided with reference to FIG. 8A are omitted.

Figure 9A:
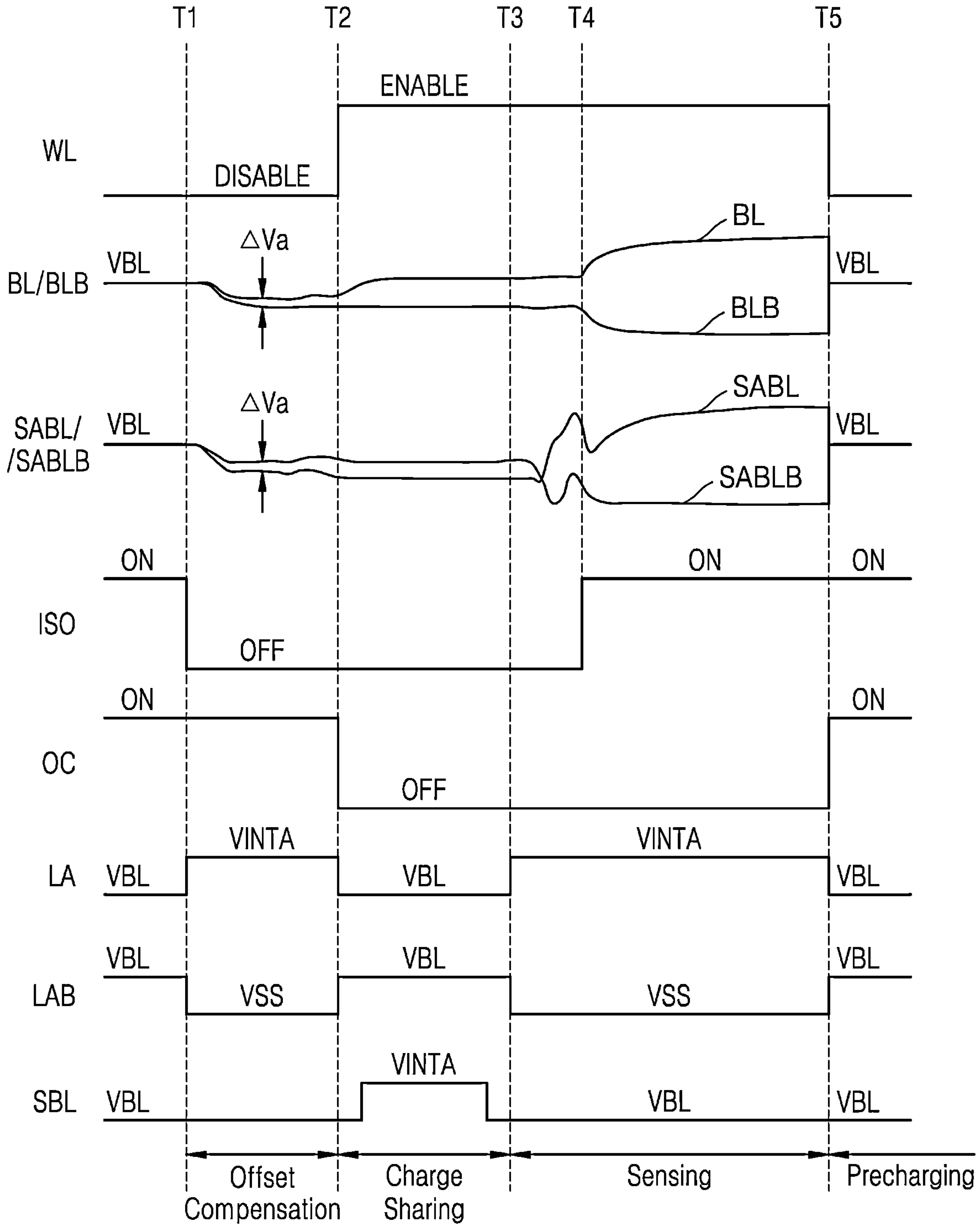
FIGS. 9A and 9B are timing diagrams for describing operations of a sense amplifier according to example embodiments.
Figure 9B:
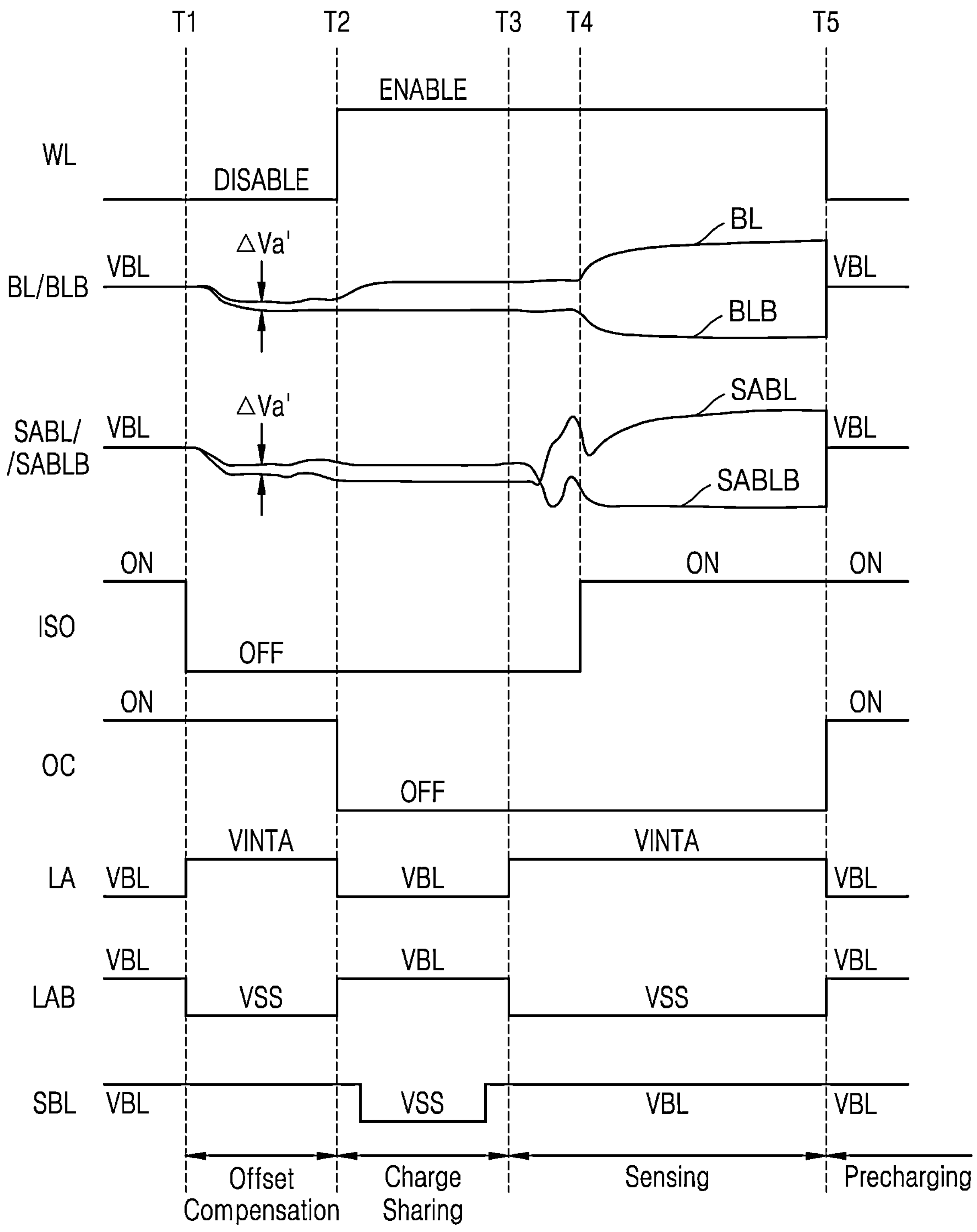

FIGS. 9A and 9B are timing diagrams for describing operations of a sense amplifier according to example embodiments.

Referring to FIGS. 7 and 9A, the offset compensation operation of the sense amplifier 28 is performed between the point in time T1 and the point in time T2, the charge sharing operation is performed between the point in time T2 and the point in time T3, the sensing operation is performed between the point in time T3 and the point in time T5, and the precharging operation is performed at the point in time T5.

During the charge sharing operation between the point in time T2 and the point in time T3, when data '1' is stored in the memory cell MC, the voltage level of the bit line BL would increase by a certain level, and when data '0' is stored in the memory cell MC, the voltage level of the bit line BL would decrease by a certain level. The charge sharing operation is dominated by the N-type sense amplifier circuit 720 connected to the bit line BL and the complementary bit line BLB. Due to the N-type sense amplifier circuit 720, the voltage difference may occur between the sensing bit line SABL and the complementary sensing bit line SABLB according to the voltage levels of the bit line BL and the complementary bit line BLB.

In some embodiments, the transistors of the sense amplifier 28 may have slow operating characteristics due to the issues on semiconductor manufacturing processes. In this case, in order to strengthen the operation of the N-type sense amplifier circuit 720, the internal power voltage VINTA may be provided to the shielding bit line SBL that is adjacent to the bit line BL that is to be sensed and amplified, as shown in FIG. 9A. Accordingly, the charge sharing operation may be rapidly performed.

In some embodiments, the memory device 20 may have a slow operating speed of data '1' due to the issues on semiconductor manufacturing processes. In this case, in order to strengthen the operating speed of data '1' of the N-type sense amplifier circuit 720, the internal power voltage VINTA may be provided to the shielding bit line SBL that is adjacent to the bit line BL that is to be sensed and amplified, as shown in FIG. 9A. Accordingly, the charge sharing of operation for data '1' may be rapidly performed.

In some embodiments, the memory device 20 may have a slow operating speed of data '0' due to the issues on semiconductor manufacturing processes. In this case, in order to strengthen the operating speed of data '0' of the N-type sense amplifier circuit 720, the ground voltage VSS may be provided to the shielding bit line SBL that is adjacent to the bit line BL that is to be sensed and amplified, as shown in FIG. 9B. Accordingly, the charge sharing of operation for data '0' may be rapidly performed.

In some embodiments, when the memory device 20 operates under high temperature environment, the operating speed of the memory device 20 needs to be reduced. In order to weaken the operation of the N-type sense amplifier circuit 720, the ground voltage VSS may be provided to the shielding bit line SBL adjacent to the bit line BL that is to be sensed and amplified as shown in FIG. 9B and the charge sharing operation may be slowly performed. On the contrary, when the memory device 20 operates under low temperature environment, the internal power voltage VINTA may be provided to the shielding bit line SBL in order to accelerate the charge sharing operation of the sense amplifier 28.

Figure 10A:
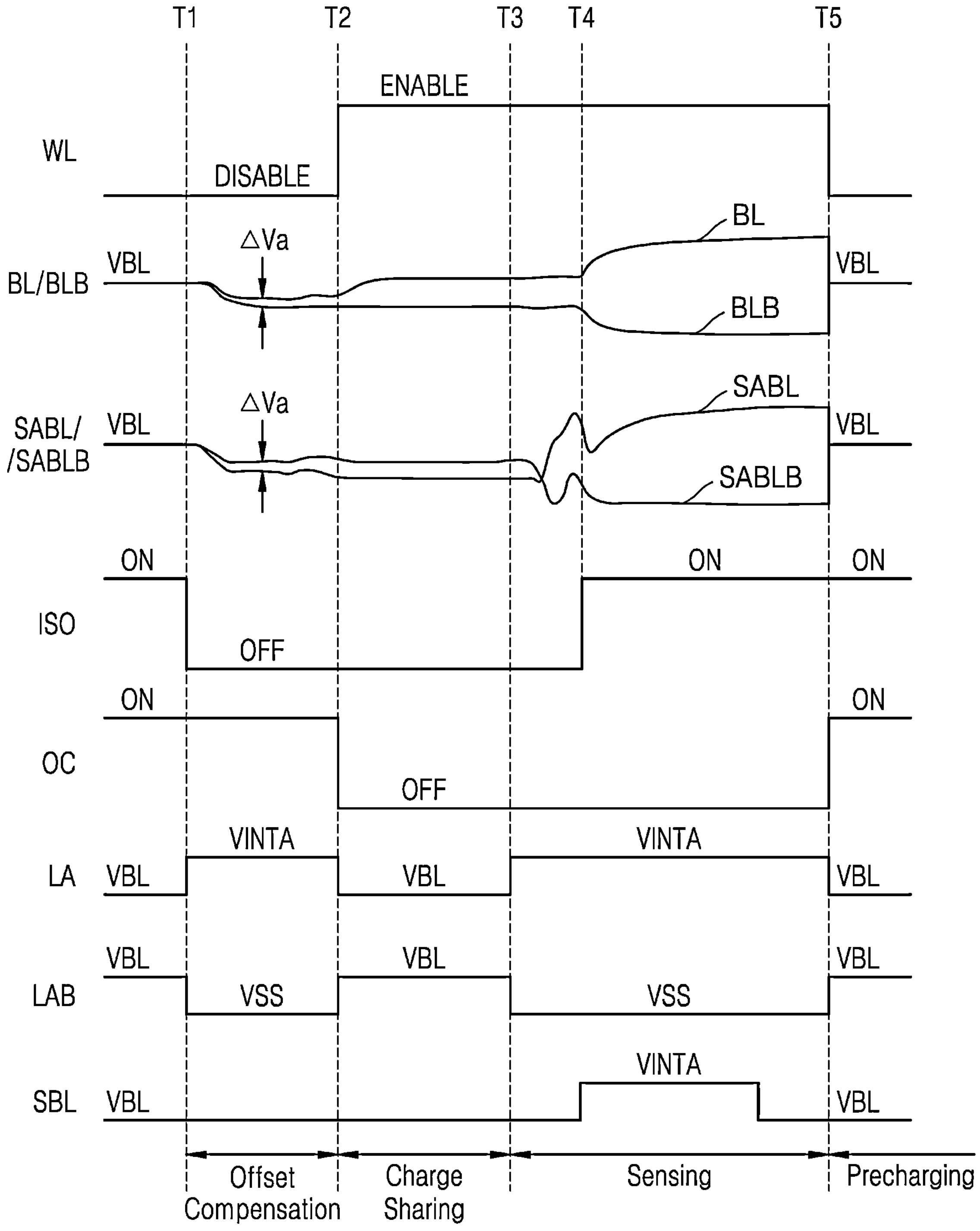
FIGS. 10A and 10B are timing diagrams for describing operations of a sense amplifier according to example embodiments.
Figure 10B:
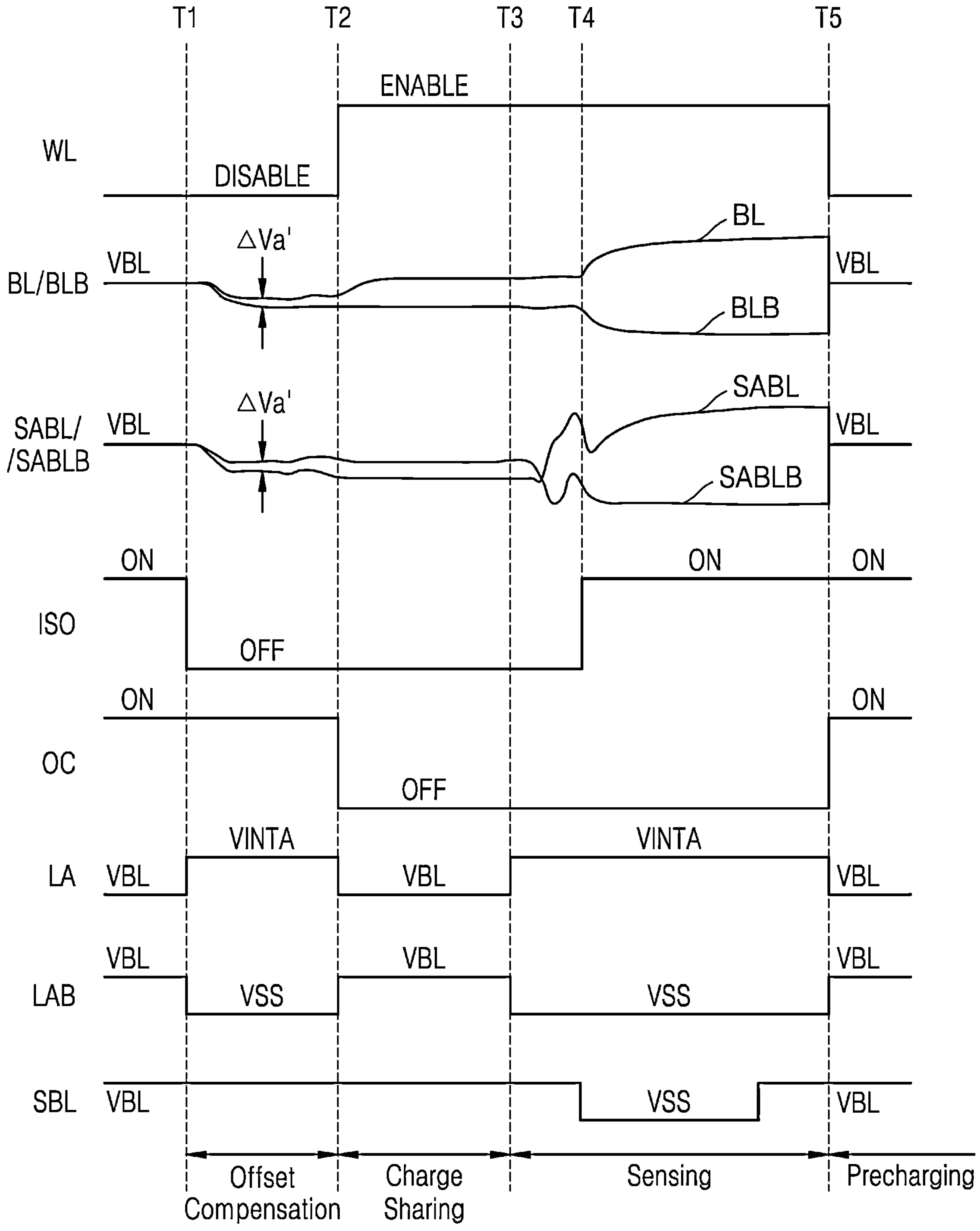

FIGS. 10A and 10B are timing diagrams for describing operations of a sense amplifier according to example embodiments.

Referring to FIGS. 7 and 10A, the offset compensation operation of the sense amplifier 28 is performed between the point in time T1 and the point in time T2, the charge sharing operation is performed between the point in time T2 and the point in time T3, the sensing operation is performed between the point in time T3 and the point in time T5, and the precharging operation is performed at the point in time T5.

During the sensing operation between the point in time T3 and the point in time T5, the sensing bit line SABL is increased to the internal power voltage VINTA level and the complementary sensing bit line SABLB may be descended to the ground voltage VSS level, based on the voltage difference between the sensing bit line SABL and the complementary sensing bit line SABLB. The sensing operation may be dominated by the P-type sense amplifier circuit 710 connected to the sensing bit line SABL and the complementary sensing bit line SABLB and the N-type sense amplifier circuit 720 connected to the bit line BL and the complementary bit line BLB. It is important for balanced sensing operation that the P-type sense amplifier circuit 710 and the N-type sense amplifier circuit 720 identically operate fast or slowly.

In some embodiments, due to the issued of the semiconductor manufacturing processes, the P-type sense amplifier circuit 710 may have fast operating characteristics and the N-type sense amplifier circuit 720 may have slow operating characteristics. In this case, in order to strengthen the operation of the N-type sense amplifier circuit 720, the internal power voltage VINTA may be provided to the shielding bit line SBL that is adjacent to the bit line BL that is to be sensed and amplified, as shown in FIG. 10A. Accordingly, the sensing operations of the P-type sense amplifier circuit 710 and the N-type sense amplifier circuit 720 may be performed fast.

In some embodiments, due to the issued of the semiconductor manufacturing processes, the P-type sense amplifier circuit 710 may have slow operating characteristics and the N-type sense amplifier circuit 720 may have fast operating characteristics. In this case, in order to weaken the operation of the N-type sense amplifier circuit 720, the ground voltage VSS may be provided to the shielding bit line SBL that is adjacent to the bit line BL that is to be sensed and amplified, as shown in FIG. 10B. Accordingly, the sensing operations of the P-type sense amplifier circuit 710 and the N-type sense amplifier circuit 720 may be performed slowly.

In embodiments, the memory device 20 may have a slow operating speed of data ‘1’ due to the issues on semiconductor manufacturing processes. In this case, in order to strengthen the operating speed of data ‘1’, the internal power voltage VINTA may be provided to the shielding bit line SBL that is adjacent to the bit line BL that is to be sensed and amplified, as shown in FIG. 10A. Accordingly, the sensing operation for data ‘1’ may be rapidly performed.

In some embodiments, the memory device 20 may have a slow operating speed of data ‘0’ due to the issues on semiconductor manufacturing processes. In this case, in order to strengthen the operating speed of data ‘0’, the ground voltage VSS may be provided to the shielding bit line SBL that is adjacent to the bit line BL that is to be sensed and amplified, as shown in FIG. 10B. Accordingly, the sensing operation for data ‘0’ may be rapidly performed.

Figure 11:
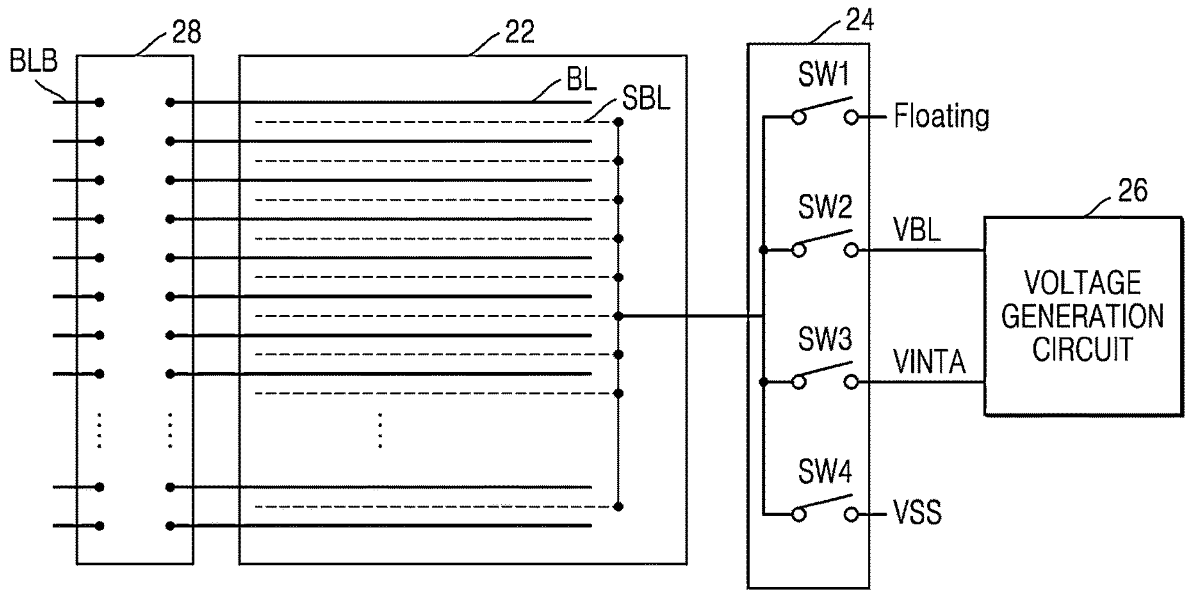
FIGS. 11 and 12 are diagrams for describing shielding bit lines according to example embodiments.
Figure 12:
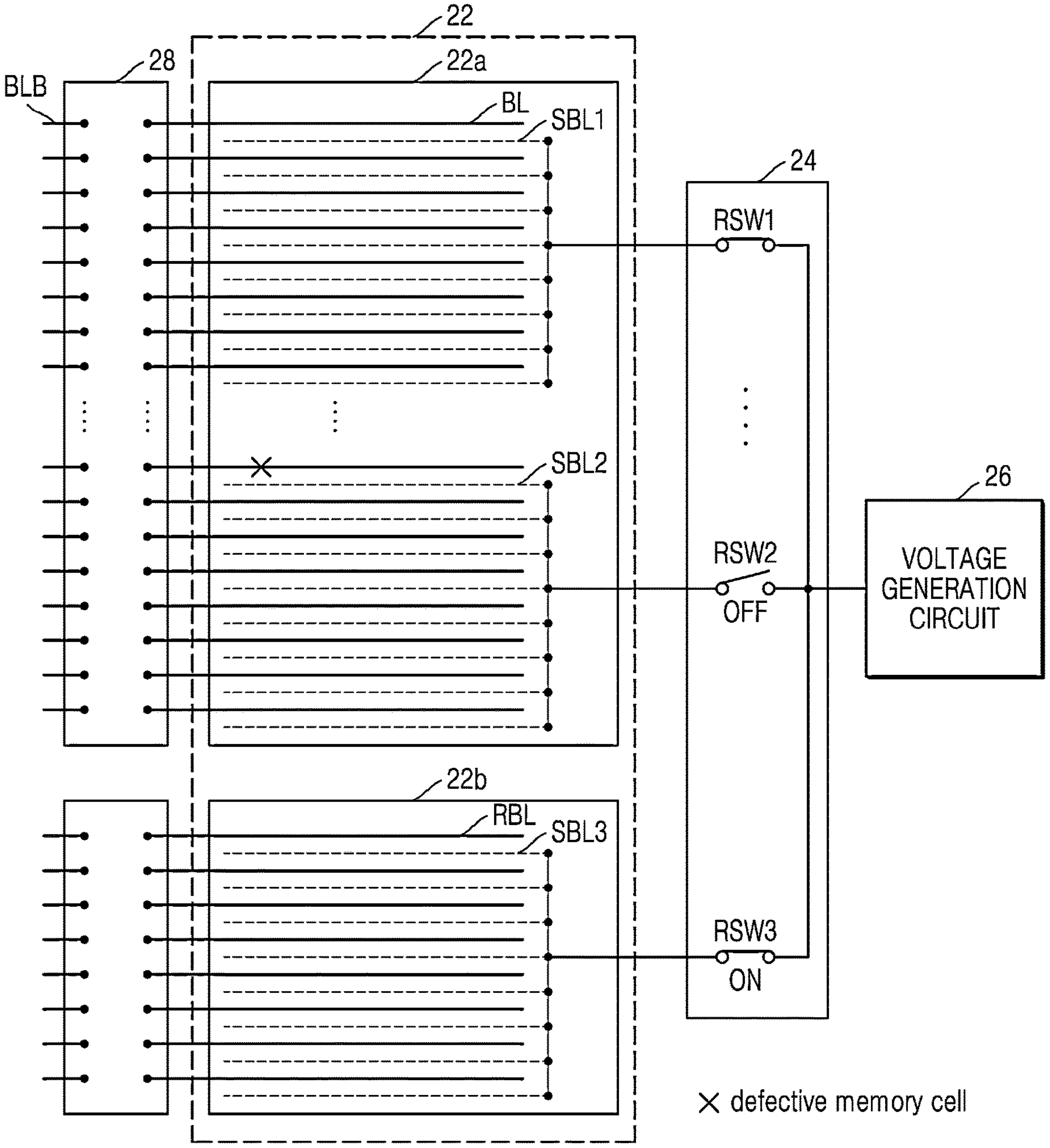

FIGS. 11 and 12 are diagrams for describing shielding bit lines according to example embodiments. FIGS. 11 and 12 illustrate a method of detecting a bit line bridge by using a voltage level provided to the shielding bit line SBL and a shielding bit line structure for a repair operation.

Referring to FIGS. 1, 2, and 11, the bit line BL of the memory cell array 22 may be connected to the sense amplifier 28 and the shielding bit line SBL may be connected to the voltage generation circuit 26 via the control circuit 24. In FIG. 11, the shielding bit line SBL is integrally configured in the memory cell array 22.

The control circuit 24 includes a plurality of first to fourth switches SW1, SW2, SW3, and SW4 connected to the shielding bit line SBL and may provide the bit line precharge voltage VBL or the internal power voltage VINTA generated from the voltage generation circuit 26 to the shielding bit line SBL. The control circuit 24 may be configured so that the shielding bit line SBL is floated when the first switch SW1 is turned on, the precharge voltage VBL is provided to the shielding bit line SBL when the second switch SW2 is turned on, the internal power voltage VINTA is provided to the shielding bit line SBL when the third switch SW3 is turned on, the ground voltage VSS is provided to the shielding bit line SBL when the fourth switch SW4 is turned on.

In some embodiments, when certain data, e.g., data ‘1’, is stored in the selected memory cell MC and then memory cell data is read, the test host 32 may allow the control circuit 24 to turn on the fourth switch SW4 and receive the data read from the selected memory cell MC. The bit line BL of the selected memory cell MC is sensed as the logic high level by the sense amplifier 28 and has the internal power voltage VINTA level, and the shielding bit line SBL would have the ground voltage VSS level due to the fourth switch SW4. This is a test method in which a defect is generated intentionally when reading data. When there is a bridge between the bit line BL and the shielding bit line SBL of the selected memory cell MC, the bit line BL becomes to have the ground voltage VSS level of the shielding bit line SBL due to the large capacity that the entire shielding bit lines SBL have, and the memory device 20 may output data ‘0’. The test host 32 may determine ‘failure’ with respect to the read data ‘0’ that is not the expected data ‘1’ from the selected memory cell MC.

In some embodiments, when certain data, e.g., data ‘0’, is stored in the selected memory cell MC and then memory cell data is read, the test host 32 may allow the control circuit 24 to turn on the third switch SW3 and receive the data read from the selected memory cell MC. The bit line BL of the selected memory cell MC is sensed as the logic low level by the sense amplifier 28 and may have the ground voltage VSS level, and the shielding bit line SBL may have the internal power voltage VINTA level due to the third switch SW3. When there is a bridge between the bit line BL and the shielding bit line SBL of the selected memory cell MC, the bit line BL becomes to have the internal power voltage VINTA level of the shielding bit line SBL due to the large capacity that the entire shielding bit lines SBL have, and the memory device 20 may output data ‘1’. The test host 32 may determine ‘failure’ with respect to the read data ‘1’ that is not the expected data ‘0’ from the selected memory cell MC.

When ‘pass’ is determined in the bit line bridge test performed by the test host 32, the control circuit 24 may provide the shielding bit line SBL with the bit line precharge voltage VBL, the internal power voltage VINTA, or the ground voltage VSS by selectively using the second to fourth switches SW2, SW3, and SW4 in the normal operation (e.g., read operation) of the memory device 20. As described above with reference to FIGS. 7, 8A, 8B, 9A, 9B, 10A, and 10B, the sense amplifier 28 may perform the offset compensation operation, the charge sharing operation, and/or the sensing operation by being affected by the bit line precharge voltage VBL, the internal power voltage VINTA, or the ground voltage VSS provided to the shielding bit line SBL.

In some embodiments, in order not to change the voltage level of the shielding bit line SBL during the operation of the sense amplifier 28, the shielding bit line SBL may be set to be maintained at the bit line precharge voltage VBL level or to be in the floating status. The control circuit 24 may allow the shielding bit line SBL to be in the floating status by using the first switch SW1, and may provide the bit line precharge voltage VBL to the shielding bit line SBL by using the second switch SW2 to control the sense amplifier 28 to operate.

Referring to FIG. 12, the memory cell array 22 may include a normal region 22*a* in which the plurality of bit lines BL are arranged and a redundancy region 22*b* in which redundant bit lines RBL are arranged. In the normal region 22*a* of the memory cell array 22, shielding bit lines SBL1 and SBL2 are arranged between the bit lines BL and across the lower portions of the bit lines BL, and in the redundancy region 22*b*, a shielding bit line SBL3 is arranged between the redundant bit lines RBL and across the lower portions of the redundant bit lines RBL.

The bit line BL of the memory cell in which a defect occurs in the normal region 22*a* may be replaced with the redundant bit line RBL of the redundancy region 22*b*. For example, eight bit lines BL including defective memory cell may be replaced with eight redundant bit lines RBL of the redundancy region 22*b*. The eight bit lines BL and the eight redundant bit lines RBL become a repair unit for performing a repairing operation. In the normal region 22*a*, the plurality of shielding bit lines SBL1 and SBL2 that are divided in correspondence with eight bit lines BL formed as the repair unit are arranged, and each of the plurality of shielding bit lines SBL1 and SBL2 may be formed of an integrated body. In the redundancy region 22*b*, integrated shielding bit lines SBL3 corresponding to the eight redundant bit lines RBL, that is, the repair unit, may be arranged. For the brevity of the drawings, eight redundant bit lines RBL that is one repair unit are represented in the redundancy region 22*b*, but the redundant bit lines RBL providing a plurality of repair units may be included.

The control unit 24 may perform the repair operation on the memory cell array 22. The control circuit 24 includes a plurality of repair switches RSW1, RSW2, and RSW3 respectively connected to the plurality of shielding bit lines SBL1, SBL2, and SBL3, and may selectively provide the bit line precharge voltage VBL or the internal power voltage VINTA generated from the voltage generation circuit 26 to the shielding bit lines SBL1, SBL2, and SBL3.

In the embodiment, when performing the repair operation in which the eight bit lines BL in the normal region 22*a* including the defective memory cell are replaced with the eight redundant bit lines RBL in the redundancy region 22*b*, the control circuit 24 may control the second repair switch RSW2 to be turned off and the third repair switch RSW3 to be turned on. This denotes that, because the eight bit lines BL in the normal region 22*a* including the defective memory cell are shielded, the second shielding bit lines SBL2 corresponding to the eight bit lines BL are also shielded by the second repair switch RSW2. In addition, in accordance with the using of eight redundant bit lines RBL instead of using the eight bit lines BL including the defective memory cell, this also denotes that the bit line precharge voltage VBL or the internal power voltage VINTA generated from the voltage generation circuit 26 is provided to the eight redundant bit lines RBL by the third repair switch RSW3. In another embodiment, the control circuit 24 may control the eight redundant bit lines RBL to be in the floating status or to be at the ground voltage VSS level by using the third repair switch RSW3.

Figure 13:
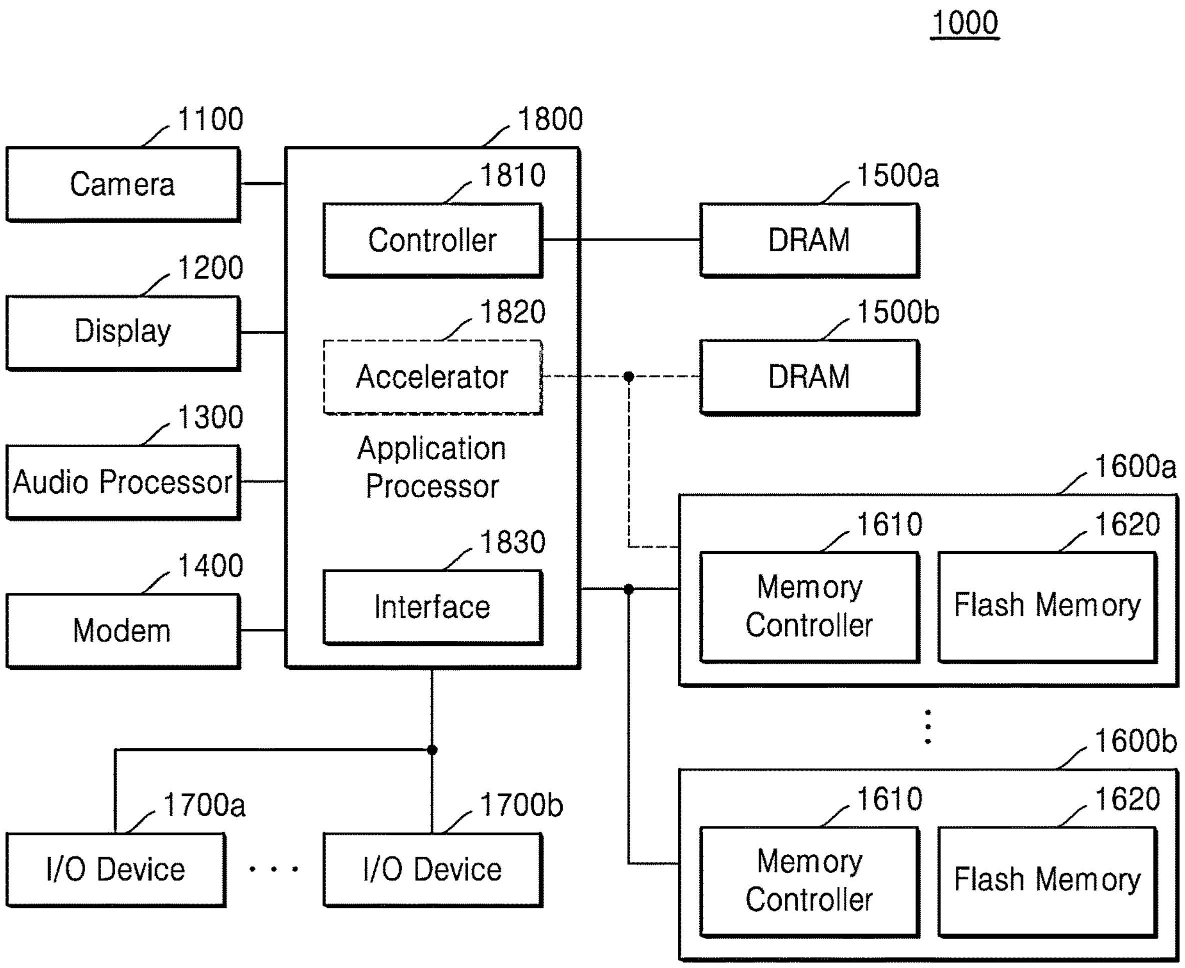
FIG. 13 is a block diagram of a system for describing an electronic appliance including the memory device according to example embodiments.

FIG. 13 is a block diagram of a system 1000 for describing an electronic appliance including the memory device according to example embodiments.

Referring to FIG. 13, the system 1000 may include a camera 1100, a display 1200, an audio processor 1300, a modem 1400, DRAMs 1500*a* and 1500*b*, storage devices 1600*a* and 1600*b*, input/output (I/O) devices 1700*a* and 1700*b*, and an application processor (AP) 1800. The system 1000 may be implemented as a laptop computer, a mobile phone, a smartphone, a personal computer (PC), a wearable device, a healthcare device, or an internet of things (IoT) device. Also, the system 1000 may be implemented as a server or a tablet PC.

The camera 1100 may capture a still image or a moving image according to a user's control, and may store or transmit to the display 1200 the captured image/image data. The audio processor 1300 may process audio data included in the storage devices 1600*a* and 1600*b* or in the content of a network. The modem 1400 may modulate and transmit a signal for transceiving wired/wireless data, and demodulate the modulated signal to restore an original signal at a receiving side. The I/O devices 1700*a* and 1700*b* may include devices providing digital inputs and/or output functions such as a universal serial bus (USB) storage, a digital camera, a secure digital (SD) card, a digital versatile disc (DVD), a network adapter, a touch screen, etc.

The AP 1800 may control overall operations of the system 1000. The AP 1800 may include a control block 1810, an accelerator block or an accelerator chip 1820, and an interface block 1830. The AP 1800 may control the display 1200 so that a portion of the content stored in the storage devices 1600*a* and 1600*b* is displayed on the display 1200. When a user input is received via the I/O devices 1700*a* and 1700*b*, the AP 1800 may perform a control operation corresponding to the user input. The AP 1800 may include an accelerator block, which is a dedicated circuit for artificial intelligence (AI) data computation, or may include an accelerator chip 1820 that is separated from the AP 1800. The DRAM 1500*b* may be additionally mounted on the accelerator block or the accelerator chip 1820. An accelerator may be a function block that specializes in performing a particular function of the AP 1800, and may include a graphics processing unit (GPU) that is a function block specialized in processing graphics data, a neural processing unit (NPU) that is a block specialized in AI calculation and inference, or a data processing unit (DPU) that is a block specialized in data transmission.

The system 1000 may include the plurality of DRAMs 1500*a* and 1500*b*. The AP 1800 may control the DRAMs 1500*a* and 1500*b* by setting a command and a mode register (MRS) in accordance with a Joint Electron Device Engineering Council (JEDEC) standard, or may set a DRAM interface protocol and communicate to use unique functions of an enterprise such as low voltage, high speed, reliability, or the like, and cyclic redundancy check (CRC)/error correction code (ECC) functions. For example, the AP 1800 may communicate with the DRAM 1500*a* via an interface conforming to JEDEC standards such as LPDDR4 and LPDDR5, and the accelerator block or accelerator chip 1820 may communicate by setting a new DRAM interface protocol for controlling the DRAM 1500*b* to be used as an accelerator having a higher bandwidth than the DRAM 1500*a*.

FIG. 13 illustrates only the DRAMs 1500*a* and 1500*b*, but the inventive concept is not limited thereto. As long as a bandwidth, a response speed, and a voltage condition of the AP 1800 or the accelerator chip 1820 are satisfied, any memory such as PRAM, SRAM, MRAM, RRAM, FRAM, or hybrid RAM may be used. The DRAMs 1500*a* and 1500*b* may have relatively less latency and bandwidth than the I/O devices 1700*a* and 1700*b* or the storage devices 1600*a* and 1600*b*. The DRAMs 1500*a* and 1500*b* may be initialized at a power-on time point of the system 1000, and when an operating system and application data are loaded, may be used as a temporary storage for the operating system and application data, or as an execution space for various software codes.

In the DRAMs 1500*a* and 1500*b*, four rules of addition/subtraction/multiplication/division, a vector computation, an address computation, or a fast Fourier transform (FFT) operation may be performed. In addition, in the DRAMs 1500*a* and 1500*b*, a function for performing inference may be carried out. Here, the inference may be performed by using a deep learning algorithm via an artificial neural network. The deep learning algorithm may include a training operation of training a model using various data and the inference operation of recognizing data by using the trained model. In an embodiment, the image captured by using the camera 1100 by the user may be signal-processed and stored in the DRAM 1500*b*, and the accelerator block or the accelerator chip 1820 may perform AI data computation that recognizes data by using data stored in the DRAM 1500*b* and the function used for the inference.

The system 1000 may include a plurality of storages or a plurality of storage devices 1600*a* and 1600*b* having a capacity greater than that of the DRAMs 1500*a* and 1500*b*. The accelerator block or the accelerator chip 1820 may perform a training operation and AI data operation by using the storage devices 1600*a* and 1600*b*. In an embodiment, each of the storage devices 1600*a* and 1600*b* may include a memory controller 1610 and a flash memory device 1620, and may efficiently perform the training operation and the AI data operation performed by the AP 1800 and/or the accelerator chip 1820 by using a computation device provided in the memory controller 1610. The storage devices 1600*a* and 1600*b* may store a picture taken by using the camera 1100, or may store data transmitted via a data network. For example, the storage devices 1600*a* and 1600*b* may store augmented reality (AR)/virtual reality (VR), high definition (HD), or ultra-high definition (UHD) content.

In the system 1000, the DRAMs 1500*a* and 1500*b* may be the memory devices described above with reference to FIGS. 1 to 7, 11, and 12. The memory device may include a sense amplifier that senses and amplifies the data stored in a memory cell selected from among a plurality of memory cells in the memory cell array. The memory cell array may include a plurality of bit lines to which the plurality of memory cells are connected, and shielding bit lines that are arranged between the plurality of bit lines and under the plurality of bit lines. The shielding bit lines may be formed of an integrated body or a plurality of bodies according to a repair unit for replacing some bit lines including a defective memory cell with redundant bit lines. A control circuit includes a plurality of switches adaptively connected to the shielding bit line(s), selectively provides the shielding bit line(s) with a bit line precharge voltage, an internal power voltage, or a ground voltage by controlling the plurality of switches during the operation of the sense amplifier, and may allow the shielding bit line(s) to have the floating status. Accordingly, reliability and accuracy of the sense amplifier may be improved, and performance of the memory device may be improved.

While the inventive concept has been particularly shown and described with reference to embodiments thereof, it will be understood that various changes in form and details may be made therein without departing from the spirit and scope of the present invention as set forth in the following claims.

What is claimed is:

1. A memory device comprising:

a memory cell array including:

a plurality of bit lines extending in a second direction to which a plurality of memory cells are connected, and a shielding bit line including a plurality of bodies alternately arranged between the plurality of bit lines in a first direction crossing the second direction and below the plurality of bit lines in a third direction perpendicular to the first and second directions;

a sense amplifier connected between a first sensing driving signal line and a second sensing driving signal line, and configured to sense and amplify data stored in a memory cell selected from among the plurality of memory cells;

a voltage generation circuit configured to generate a bit line precharge voltage and an internal power voltage based on a power voltage of the memory device; and a control circuit configured to selectively provide the shielding bit line with the bit line precharge voltage, the internal power voltage, or a ground voltage, wherein a level of the internal power voltage is greater than a level of the bit line precharge voltage.

2. The memory device of claim 1, wherein the sense amplifier is configured to perform an offset compensation operation, in which a difference between threshold voltages of transistors included in the sense amplifier is represented between a bit line to which the selected memory cell is connected and a complementary bit line, and wherein the control circuit is configured to, during the offset compensation operation, provide the internal power voltage to the first sensing driving signal line, and provide the ground voltage to the second sensing driving signal line.

3. The memory device of claim 2, wherein the control circuit is configured to:

provide the bit line precharge voltage to the shielding bit line before sensing and amplifying data of the selected memory cell, and provide the internal power voltage to the shielding bit line during the offset compensation operation of the sense amplifier.

4. The memory device of claim 2, wherein the control circuit is configured to:

provide the bit line precharge voltage to the shielding bit line before sensing and amplifying data of the selected memory cell, and provide the ground voltage to the shielding bit line during the offset compensation operation of the sense amplifier.

5. The memory device of claim 2, wherein the sense amplifier is configured to, after performing the offset compensation operation, perform a charge sharing operation, based on a charge stored in the selected memory cell, and wherein the control circuit is configured to provide the bit line precharge voltage to the first and second sensing driving signal lines during the charge sharing operation.

6. The memory device of claim 5, wherein the control circuit is configured to provide the internal power voltage to the shielding bit line during the charge sharing operation of the sense amplifier.

7. The memory device of claim 5, wherein the control circuit is configured to provide the ground voltage to the shielding bit line during the charge sharing operation of the sense amplifier.

8. The memory device of claim 5, wherein the sense amplifier is configured to, after performing the charge sharing operation, perform a sensing operation, based on voltage levels of the bit line and the complementary bit line, and wherein the control circuit is configured to, during the sensing operation, provide the internal power voltage to the first sensing driving signal line, and provide the ground voltage to the second sensing driving signal line.

9. The memory device of claim 8, wherein the control circuit is configured to provide the internal power voltage to the shielding bit line during the sensing operation of the sense amplifier.

10. The memory device of claim 8, wherein the control circuit is configured to provide the ground voltage to the shielding bit line during the sensing operation of the sense amplifier.

11. The memory device of claim 1, wherein the control circuit is configured to control the shielding bit line to be in a floating status.

12. A memory device comprising:

a memory cell array including a normal region in which a plurality of bit lines extending in a second direction to which a plurality of memory cells are connected are arranged and a redundancy region in which redundant bit lines are arranged, wherein:

some bit lines of the plurality of bit lines includes defective memory cells being set as a repair unit replaced with the redundant bit lines, and the memory cell array includes:

a first shielding bit line including a plurality of first bodies alternately arranged between first bit lines of the plurality of bit lines in a first direction crossing the second direction corresponding to a first repair unit and arranged below the first bit lines in a third direction perpendicular to the first and second directions, a second shielding bit line including a plurality of second bodies alternately arranged between second bit lines of the plurality of bit lines in the first direction corresponding to a second repair unit and arranged below the second bit lines in the third direction, and a third shielding bit line arranged between the redundant bit lines in the first direction and below the redundant bit lines in the third direction;

a voltage generation circuit configured to generate a bit line precharge voltage and an internal power voltage based on a power voltage of the memory device; and a control circuit configured to, based on a memory cell selected from among the plurality of memory cells being connected to one of the first bit lines:

electrically connect the voltage generation circuit to the first shielding bit line, and selectively provide the first shielding bit line with the bit line precharge voltage, the internal power voltage, or a ground voltage, wherein a level of the internal power voltage is greater than a level of the bit line precharge voltage.

13. The memory device of claim 12, wherein the control circuit is configured to, based on the defective memory cells being connected to the second bit lines:

block the voltage generation circuit to be electrically disconnected to the second shielding bit line, electrically connect the voltage generation circuit to the third shielding bit line, and selectively provide the third shielding bit line with the bit line precharge voltage or the internal power voltage.

14. The memory device of claim 12, further comprising:

a sense amplifier connected between a first sensing driving signal line and a second sensing driving signal line, and the sense amplifier configured to:

sense and amplify data stored in the selected memory cell, and perform an offset compensation operation in which a difference between threshold voltages of transistors included in the sense amplifier is represented between a bit line to which the selected memory cell is connected and a complementary bit line, wherein the control circuit is configured to, during the offset compensation operation, provide the internal power voltage to the first sensing driving signal line, and provide the ground voltage to the second sensing driving signal line.

15. The memory device of claim 14, wherein the control circuit is configured to selectively provide the first shielding bit line with the internal power voltage or the ground voltage during the offset compensation operation of the sense amplifier.

16. The memory device of claim 14, wherein the sense amplifier is configured to, after performing the offset compensation operation, perform a charge sharing operation, based on a charge stored in the selected memory cell, and wherein the control circuit is configured to provide the bit line precharge voltage to the first and second sensing driving signal lines during the charge sharing operation.

17. The memory device of claim 16, wherein the control circuit is configured to selectively provide the first shielding bit line with the internal power voltage or the ground voltage during the charge sharing operation of the sense amplifier.

18. The memory device of claim 16, wherein the sense amplifier is configured to, after performing the charge sharing operation, perform a sensing operation, based on voltage levels of the bit line and the complementary bit line, and wherein the control circuit is configured to, during the sensing operation, provide the internal power voltage to the first sensing driving signal line, and provide the ground voltage to the second sensing driving signal line.

19. The memory device of claim 18, wherein the control circuit is configured to selectively provide the first shielding bit line with the internal power voltage or the ground voltage during the sensing operation of the sense amplifier.

20. A memory device comprising:

a memory cell array including:

a plurality of bit lines extending in a second direction to which a plurality of memory cells are connected, and shielding bit lines arranged between the plurality of bit lines in a first direction crossing the second direction and below the plurality of bit lines in a third direction perpendicular to the first and second directions, the shielding bit lines being provided with a plurality of bodies;

a voltage generation circuit configured to generate a bit line precharge voltage and an internal power voltage based on a power voltage of the memory device; and a control circuit including a plurality of switches that are adaptively electrically connected to the plurality of bodies of the shielding bit lines, respectively, wherein the control circuit is configured to:

selectively provide the bit line precharge voltage, the internal power voltage, or a ground voltage to each of the plurality of bodies of the shielding bit lines in response to the plurality of switches being turned on or turned off, and allow each of the plurality of bodies of the shielding bit lines to be in a floating status, and wherein a level of the internal power voltage is greater than a level of the bit line precharge voltage.

* * * * *